United States Patent
Cha et al.

(10) Patent No.: US 11,973,066 B2
(45) Date of Patent: Apr. 30, 2024

(54) LIGHT-EMITTING ELEMENT, METHOD OF MANUFACTURING LIGHT-EMITTING ELEMENT, AND DISPLAY DEVICE INCLUDING LIGHT-EMITTING ELEMENT

(71) Applicant: Samsung Display Co., LTD., Yongin-si (KR)

(72) Inventors: Hyung Rae Cha, Yongin-si (KR); Dong Uk Kim, Yongin-si (KR); Sung Ae Jang, Yongin-si (KR); Ji Hyun Ham, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 66 days.

(21) Appl. No.: 17/244,397

(22) Filed: Apr. 29, 2021

(65) Prior Publication Data

US 2022/0068892 A1    Mar. 3, 2022

(30) Foreign Application Priority Data

Aug. 31, 2020    (KR) .......................... 10-2020-0110403

(51) Int. Cl.
*H01L 25/075* (2006.01)
*H01L 27/12* (2006.01)
(Continued)

(52) U.S. Cl.
CPC ...... *H01L 25/0753* (2013.01); *H01L 27/1214* (2013.01); *H01L 33/007* (2013.01);
(Continued)

(58) Field of Classification Search
None
See application file for complete search history.

(56) References Cited

U.S. PATENT DOCUMENTS

| 6,913,985 B2 | 7/2005 | Ogihara et al. |
| 9,012,939 B2 | 4/2015 | Chen et al. |
| (Continued) | | |

FOREIGN PATENT DOCUMENTS

| JP | 2005-51117 | 2/2005 |
| KR | 10-1198357 | 11/2012 |
| (Continued) | | |

OTHER PUBLICATIONS

Machine translation English-language WO-2020050468-A1.*
International Search Report corresponding to International Application No. PCT/KR2021/011230 dated Dec. 9, 2021.

*Primary Examiner* — Robert K Carpenter
(74) *Attorney, Agent, or Firm* — KILE PARK REED & HOUTTEMAN PLLC

(57) ABSTRACT

A light-emitting element includes a first end portion and a second end portion disposed in a length direction of the light-emitting element, a first electrode corresponding to the first end portion, a first semiconductor layer on the first electrode, an active layer on the first semiconductor layer, a second semiconductor layer on the active layer, and a second electrode on the second semiconductor layer and corresponding to the second end portion. The second electrode includes a first layer on the first semiconductor layer, and a second layer on the first layer. The first semiconductor layer includes a p-type semiconductor layer doped with a p-type dopant. The second semiconductor layer includes an n-type semiconductor layer doped with an n-type dopant. The first electrode is in ohmic contact with the first semiconductor layer. The second electrode is in ohmic contact with the second semiconductor layer.

13 Claims, 34 Drawing Sheets

(51) Int. Cl.
*H01L 33/00* (2010.01)
*H01L 33/22* (2010.01)
*H01L 33/42* (2010.01)
*H01L 33/44* (2010.01)
*H01L 33/62* (2010.01)

(52) U.S. Cl.
CPC .......... *H01L 33/0093* (2020.05); *H01L 33/22* (2013.01); *H01L 33/42* (2013.01); *H01L 33/44* (2013.01); *H01L 33/62* (2013.01); *H01L 2933/0016* (2013.01); *H01L 2933/0025* (2013.01)

(56) References Cited

U.S. PATENT DOCUMENTS

| | | |
|---|---|---|
| 9,570,425 B2 | 2/2017 | Do |
| 10,580,859 B2 | 3/2020 | Do et al. |
| 2014/0209960 A1* | 7/2014 | Park .................. H01L 33/42 257/99 |
| 2019/0378953 A1* | 12/2019 | Min .................. H01L 33/38 |
| 2021/0202450 A1 | 7/2021 | Min et al. |

FOREIGN PATENT DOCUMENTS

| | | | |
|---|---|---|---|
| KR | 10-2013-0143111 | 12/2013 | |
| KR | 10-1436123 | 11/2014 | |
| KR | 10-1787435 | 10/2017 | |
| KR | 10-2020-0029100 | 3/2020 | |
| KR | 10-2020-0088934 | 7/2020 | |
| WO | WO-2020050468 A1 * | 3/2020 | ............. G06F 3/147 |

\* cited by examiner

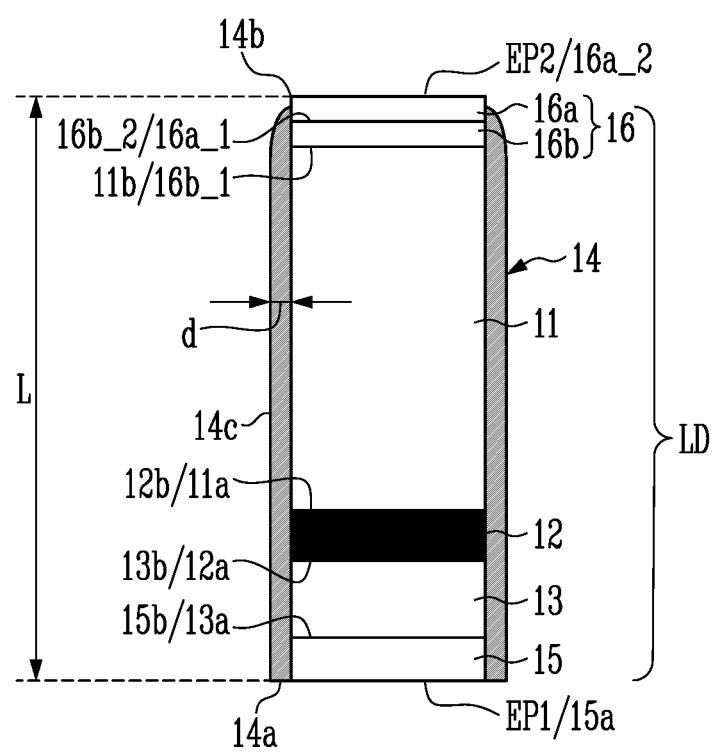

LIGHT-EMITTING ELEMENT, METHOD OF MANUFACTURING LIGHT-EMITTING ELEMENT, AND DISPLAY DEVICE INCLUDING LIGHT-EMITTING ELEMENT

CROSS-REFERENCE TO RELATED APPLICATION

This application claims priority to and benefits of Korean Patent Application No. 10-2020-0110403 under 35 U.S.C. § 119, filed on Aug. 31, 2020 in the Korean Intellectual Property Office, the entire contents of which are incorporated herein by reference.

BACKGROUND

1. Field

The disclosure relates to a light-emitting element, a method of manufacturing the light-emitting element, and a display device including the light-emitting element.

2. Description of the Related Art

As interest in information displays and demands on using portable information media increase, research and commercialization of display devices are actively performed.

SUMMARY

An embodiment provides a light-emitting element in which an ohmic electrode is formed at each of both end portions thereof, and one surface thereof exposed from the ohmic electrode has constant surface roughness so that both end portions have uniform characteristics, and also provides a method of manufacturing the same.

In embodiments of the disclose, a display device includes the above-described light-emitting elements.

In an embodiment, a light-emitting element may include a first end portion and a second end portion that are disposed in a length direction of the light-emitting element, a first electrode corresponding to the first end portion, a first semiconductor layer disposed on the first electrode, an active layer disposed on the first semiconductor layer, a second semiconductor layer disposed on the active layer, and a second electrode disposed on the second semiconductor layer and corresponding to the second end portion. The second electrode may include a first layer disposed on the first semiconductor layer, and a second layer disposed on the first layer.

In an embodiment, the first semiconductor layer may include a p-type semiconductor layer doped with a p-type dopant, and the second semiconductor layer may include an n-type semiconductor layer doped with an n-type dopant.

In an embodiment, the first electrode may be in ohmic contact with the first semiconductor layer, and the second electrode may be in ohmic contact with the second semiconductor layer.

In an embodiment, the first layer and the second layer may include a transparent conductive material.

In an embodiment, the first layer may include a transparent metal, and the second layer may include a transparent conductive oxide.

In an embodiment, an outer surface of the second layer may include an uneven pattern having substantially regular periodicity.

In an embodiment, an outer surface of the second layer may include an uneven pattern having a substantially irregular shape.

In an embodiment, the light-emitting element may include an insulting film surrounding an outer circumferential surface of each of the first electrode, the first semiconductor layer, the active layer, the second semiconductor layer, and the second electrode.

In an embodiment, the thickness of a region of the insulating film corresponding to the second end portion may gradually decrease upward in the length direction.

In an embodiment, the region of the insulating film corresponding to the second end portion may have a shape different from the region of the insulating film corresponding to the first end portion.

In an embodiment, the insulating film may surround a portion of the outer circumferential surface of the second electrode to expose at least a portion of the second electrode.

In an embodiment, a lower surface of the first electrode may be substantially flat and parallel to an upper surface of the second electrode in the length direction.

The above-described light-emitting element may be manufactured through a method of manufacturing a light-emitting element may include providing a first substrate; forming a light-emitting stack including a first electrode, a first semiconductor layer, an active layer, a second semiconductor layer, and a second electrode stacked on a first surface of the first substrate; forming a buffer layer on the second electrode; forming an adhesive layer on the buffer layer and arranging a second substrate on the adhesive layer to bond the first substrate and the second substrate; turning the first substrate such that a second surface of the first substrate faces upward, the first surface and the second surface of the first substrate being opposite to each other; removing the first substrate using a laser lift-off method to expose the first electrode; etching the light-emitting stack in a vertical direction to form a light-emitting stack pattern and exposing a region of the buffer layer; forming an insulating material layer on a surface of the light-emitting stack pattern and on the region of the buffer layer; etching the insulating material layer in the vertical direction to form an insulating film surrounding the surface of the light-emitting stack pattern; and separating the light-emitting stack pattern surrounded by the insulating film from the second substrate using a chemical lift-off method to form at least one light-emitting element.

In an embodiment, at least one the light-emitting element may include the second electrode, the second semiconductor layer, the active layer, the first semiconductor layer, and the first electrode disposed in a length direction of the light emitting element.

In an embodiment, the first semiconductor layer may include an n-type semiconductor layer doped with an n-type dopant, and the second semiconductor layer may include a p-type semiconductor layer doped with a p-type dopant.

In an embodiment, the first electrode may include a first layer disposed on the first semiconductor layer, and a second layer disposed on the first layer, and the first layer and the second layer may include a transparent conductive material. The first layer may include a transparent metal, and the second layer may include a transparent conductive oxide.

In an embodiment, the buffer layer may be an inorganic insulating film including an inorganic material.

In an embodiment, the forming of the light-emitting stack may include forming the first electrode on the first substrate; forming the first semiconductor layer on the first electrode; forming the active layer on the first semiconductor layer;

forming the second semiconductor layer on the active layer; and forming the second electrode on the second semiconductor layer.

In an embodiment, the forming of the light-emitting stack pattern may include forming a mask on the exposed first electrode; forming at least one fine pattern on the mask; etching the mask to form at least one mask pattern corresponding to the at least one fine pattern; vertically etching the remaining region excluding one region corresponding to the at least one mask pattern to form a groove; and removing the at least one mask pattern.

A display device according to an embodiment may include a first pixel electrode and a second pixel electrode which are spaced apart from each other in a first direction on a substrate and extend in a second direction different from the first direction, and light-emitting elements which are disposed between the first pixel electrode and the second pixel electrode and each include a first end portion and a second end portion in a length direction of the light emitting elements.

In an embodiment, each of the light-emitting elements may include a first electrode corresponding to the first end portion, a first semiconductor layer disposed on the first electrode, an active layer disposed on the first semiconductor layer, a second semiconductor layer disposed on the active layer, and a second electrode corresponding to the second end portion and including a first layer disposed on the second semiconductor layer and a second layer disposed on the first layer.

In an embodiment, each of the first and second end portions may overlap one of the first and the second pixel electrodes in a cross-section view.

In an embodiment, the display device may further include a first contact electrode disposed on the first pixel electrode and the first end portion of each of the light-emitting elements; and a second contact electrode disposed on the second pixel electrode and the second end portion of each of the light-emitting elements. The first contact electrode may be electrically connected to the first pixel electrode, and the second contact electrode may be electrically connected to the second pixel electrode.

BRIEF DESCRIPTION OF THE DRAWINGS

FIGS. 2 to 4B are cross-sectional views illustrating the light-emitting element of FIG. 1 according to various embodiments.

FIG. 21 is a schematic plan view of a display device using the light-emitting element illustrated in FIGS. 1 and 2 as a light source.

DETAILED DESCRIPTION OF THE EMBODIMENTS

Figure 1:
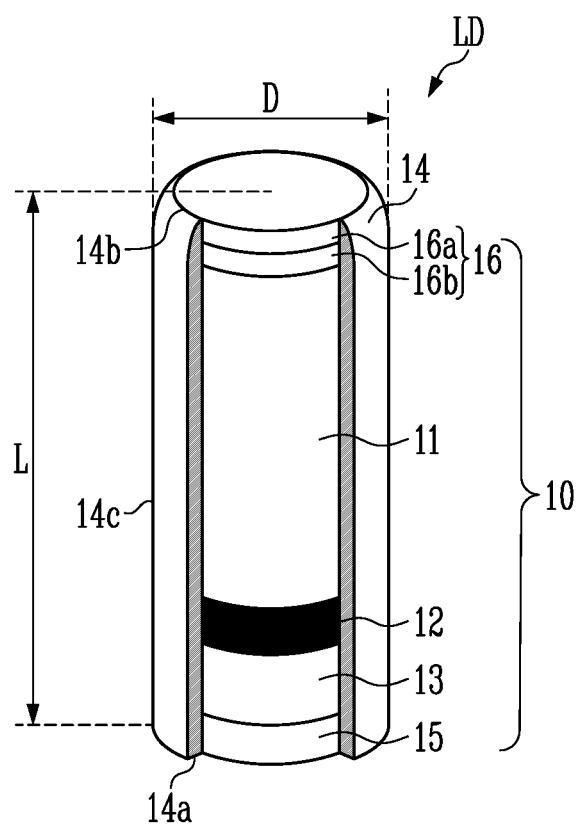
FIG. 1 is a schematic perspective view illustrating a light-emitting element according to an embodiment.

While the disclosure is open to various modifications and alternative embodiments, specific embodiments thereof will be described and illustrated by way of example in the accompanying drawings. However, it should be understood that there is no intention to limit the disclosure to the particular embodiments disclosed, and, on the contrary, the disclosure is to cover all modifications, equivalents, and alternatives falling within the spirit and scope of the disclosure.

Like numbers refer to like elements throughout the drawings. In the accompanying drawings, the sizes of structures may be exaggerated for clarity. Although the terms "first," "second," etc. are used herein to describe various elements, these elements should not be limited by these terms. The terms are used only for the purpose of distinguishing one element from another. For example, without departing from the scope of the disclosure, a first element could be termed a second element, and similarly a second element could be also termed a first element. A single form of expression is meant to include multiple elements unless otherwise stated.

It will be understood that the terms "comprises" and/or "comprising," or "includes" and/or "including," when used in this specification, specify the presence of stated features, integers, steps, operations, elements, components, and/or combinations thereof but do not preclude the presence or addition of one or more other features, integers, steps, operations, elements, components, and/or combinations thereof. In addition, when a layer, a film, an area, or a plate is referred to as being "on" or "under" another layer, another film, another area, or another plate, it can be "directly" or "indirectly" on the other layer, film, area, plate, or one or more intervening layers may also be present. Further, in the disclosure, when a part of a layer, a film, an area, a plate, and the like is formed on another part, a direction, in which the part is formed, is not limited only to an up direction, and includes a lateral direction or a down direction. On the contrary, it will be understood that when an element such as a layer, film, area, or plate is referred to as being "beneath" another element, it can be directly beneath the other element or intervening elements may also be present.

In the application, when it is described that an element (such as a first element) is "operatively or communicatively coupled with/to," "electrically connected," or "connected" to another element (such as a second element), the element can be directly connected to the other element or can be connected to the other element through another element (e.g., a third element). On the contrary, when it is described that an element (e.g., a first element) is "directly connected" or "directly coupled" to another element (e.g., a second element), it means that there is no intermediate element (e.g., a third element) between the element and the other element.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specifications and the claims, the "gradually" means that a change will occur at a moderate rate, opposed to an abrupt or sudden change, as understood by one of ordinary skill in the art.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments and other subject matters necessary for those skilled in the art to easily understand the contents of the disclosure will be described in detail with reference to the accompanying drawings. In the following description, the singular forms "a," "an," and "the" are intended to include the plural forms as well, unless the context clearly indicates otherwise.

FIG. 1 is a schematic perspective view illustrating a light-emitting element according to an embodiment, and FIGS. 2 to 4B are cross-sectional views illustrating the light-emitting element of FIG. 1 according to the embodiments.

In an embodiment, the type and/or shape of the light-emitting element are not limited to the embodiments illustrated in FIGS. 1 to 4B.

Referring to FIGS. 1 to 4B, a light-emitting element LD may include a first semiconductor layer 11, a second semiconductor layer 13, and an active layer 12 interposed between the first semiconductor layer 11 and the second semiconductor layer 13. The light-emitting element LD may include a first electrode 16 and a second electrode 15.

In an embodiment, the light-emitting element LD may be implemented with a light-emitting stack pattern 10 in which the second electrode 15, the second semiconductor layer 13, the active layer 12, the first semiconductor layer 11, and the first electrode 16 are stacked.

The light-emitting element LD may be provided in a shape that extends in one direction. When it is assumed that an extending direction of the light-emitting element LD is a direction of a length thereof, the light-emitting element LD may include a first end portion EP1 (or lower end portion) and a second end portion EP2 (or upper end portion) in the extending direction. One semiconductor layer of the first and second semiconductor layers 11 and 13 may be disposed at the first end portion EP1 (or lower end portion) of the light-emitting element LD, and the other semiconductor layer of the first and second semiconductor layers 11 and 13 may be disposed at the second end portion EP2 (or upper end portion) of the light-emitting element LD. In an embodiment, the second semiconductor layer 13 may be disposed at the first end portion EP1 (or lower end portion) of the light-emitting element LD, and the first semiconductor layer 11 may be disposed at the second end portion EP2 (or upper end portion) of the light-emitting element LD.

The light-emitting element LD may be provided in various shapes. As an example, the light-emitting element LD may have a rod-like shape, a bar-like shape, or a column shape which is long in a direction of a length L thereof (i.e., has an aspect ratio greater than one). In an embodiment, the length L of the light-emitting element LD in the direction of the length thereof may be greater than a diameter D (or width of a cross section) thereof. The light-emitting element LD may include, for example, a light-emitting diode (LED) manufactured in a very small size to such an extent as to have the diameter D and/or the length L ranging from a nanoscale to a microscale.

The diameter D of the light-emitting element LD may be in a range of about 0.5 μm to about 500 μm, and the length L thereof may be in a range of about 1 μm to about 10 μm. However, the diameter D and the length L of the light-emitting element LD are not limited thereto, and the size of the light-emitting element LD may be changed such that the light-emitting element LD meets requirements (or design conditions) of a lighting device or a self-luminous display device to which the light-emitting element LD is applied.

The second semiconductor layer 13 may include, for example, at least one p-type semiconductor layer. As an example, the second semiconductor layer 13 may include a p-type semiconductor layer which includes at least one semiconductor material selected from InAlGaN, GaN, AlGaN, InGaN, AlN, and InN and is doped with a second conductive type dopant (or p-type dopant) such as magnesium (Mg). However, the material constituting the second semiconductor layer 13 is not limited thereto, and the second semiconductor layer 13 may be made of various materials. In an embodiment, the second semiconductor layer 13 may include a gallium nitride (GaN) semiconductor material doped with the second conductive dopant (or p-type dopant). The second semiconductor layer 13 may include an upper surface 13b in contact with the active layer 12 and a lower surface 13a in contact with the second electrode 15 in the direction of the length of the light-emitting element LD.

The active layer 12 may be disposed on the second semiconductor layer 13 and may be formed to have a single or multi-quantum well structure. As an example, when the active layer 12 is formed to have a multi-quantum well structure, in the active layer 12, a barrier layer (not illustrated), a strain reinforcing layer, and a well layer may be repeatedly and periodically stacked as one unit. The strain reinforcing layer may have a smaller lattice constant than the barrier layer to further reinforce strain, for example, compression stress applied to the well layer. However, the structure of the active layer 12 is not limited to the above-described embodiment.

The active layer 12 may emit light having a wavelength of about 400 nm to about 900 nm and may have a double hetero structure. In an embodiment, a clad layer (not illustrated) doped with a conductive dopant may be formed on an upper portion and/or a lower portion of the active layer 12 in the direction of the length L of the light-emitting element LD. As an example, the clad layer may be formed as an AlGaN layer or an InAlGaN layer. According to embodiments, a material such as AlGaN or InAlGaN may be used to form the active layer 12, and in addition, various materials may constitute the active layer 12. The active layer 12 may include a first surface 12a in contact with the second semiconductor layer 13 and a second surface 12b in contact with the first semiconductor layer 11.

When an electric field having a certain or predetermined voltage or more is applied to both end portions of the light-emitting element LD, electron-hole pairs combine, and thus, the light-emitting elements LD emits light. By controlling the light emission of the light-emitting element LD using such a principle, the light-emitting element LD may be used as a light source (or light-emitting source) of various light-emitting devices including pixels of a display device.

The first semiconductor layer 11 may be disposed on the second surface 12b of the active layer 12 and may include a semiconductor layer which is a different type from the second semiconductor layer 13. As an example, the first semiconductor layer 11 may include at least one n-type semiconductor layer. For example, the first semiconductor layer 11 may be an n-type semiconductor layer which includes any one semiconductor material selected from InAlGaN, GaN, AlGaN, InGaN, AlN, and InN and is doped with a first conductive type dopant (or n-type dopant) such as silicon (Si), germanium (Ge), or tin (Sn). However, the material constituting the first semiconductor layer 11 is not limited thereto, and the first semiconductor layer 11 may be made of various materials. In an embodiment, the first semiconductor layer 11 may include a gallium nitride (GaN) semiconductor material doped with the first conductive dopant (or n-type dopant). The first semiconductor layer 11 may include a lower surface 11a in contact with the second surface 12b of the active layer 12 and an upper surface 11b in contact with the first electrode 16 in the direction of the length L of the light-emitting element LD.

In an embodiment, the second semiconductor layer 13 and the first semiconductor layer 11 may have different thicknesses in the direction of the length L of the light-emitting element LD. As an example, the first semiconductor layer 11 may have a thickness that is relatively greater than that of the second semiconductor layer 13 in the direction of the length L of the light-emitting element LD. Accordingly, the active layer 12 of the light-emitting element LD may be disposed closer to the lower surface 13a of the second semiconductor layer 13 than the upper surface 11b of the first semiconductor layer 11.

Each of the first semiconductor layer 11 and the second semiconductor layer 13 are illustrated as being formed as one layer, but the embodiments are not limited thereto. In an embodiment, each of the first semiconductor layer 11 and the second semiconductor layer 13 may further include at least one layer, for example, a clad layer and/or a tensile strain barrier reducing (TSBR) layer according to a material of the active layer 12. The TSBR layer may be a strain reducing layer disposed between semiconductor layers having different lattice structures to serve as a buffer for reducing a lattice constant difference. The TSBR layer may be formed as a p-type semiconductor layer including p-GaInP, p-AlInP, or p-AlGaInP, but the embodiments are not limited thereto.

The second electrode 15 may be in contact with the lower surface 13a of the second semiconductor layer 13. The second electrode 15 may be an ohmic contact electrode electrically connected to the second semiconductor layer 13. The second electrode 15 may include a conductive material having a transmittance (or light transmittance) of a certain or predetermined level or more. As an example, the second electrode 15 may be made of from chromium (Cr), titanium (Ti), aluminum (Al), gold (Au), nickel (Ni), indium tin oxide (ITO), indium zinc oxide (IZO), indium tin zinc oxide (ITZO), an oxide or alloy of these materials or a mixture of these materials. The second electrode 15 may be substantially transparent. Accordingly, light generated in the active layer 12 of the light-emitting element LD may pass through the second electrode 15 to be externally emitted from the light-emitting element LD. The second electrode 15 may include an upper surface 15b in contact with the second semiconductor layer 13 and a lower surface 15a externally exposed in the direction of the length L of the light-emitting element LD. In an embodiment, the lower surface 15a of the second electrode 15 may be the first end portion EP1 (or lower end portion) of the light-emitting element LD.

The first electrode 16 may be provided on the first semiconductor layer 11 and may be in contact with the upper surface 11b of the first semiconductor layer 11. In an embodiment, the first electrode 16 may include a first layer 16a and a second layer 16b. As an example, the first electrode 16 may include the second layer 16b and the first layer 16a which are disposed in the direction of the length L of the light-emitting element LD.

The second layer 16b may be an ohmic contact electrode which is in direct contact with the upper surface 11b of the first semiconductor layer 11. The second layer 16b may include a conductive material having a transmittance (or light transmittance) of a certain or predetermined level or more. As an example, the second layer 16b may include a transparent conductive oxide selected from the materials described as structure materials of the second electrode 15. According to embodiments, the second layer 16b may be made of indium (In), titanium (Ti), chromium (Cr), nickel (Ni), or the like in the form of a thin film. The second layer 16b may include a lower surface 16b_1 in contact with the first semiconductor layer 11 and an upper surface 16b_2 in contact with the first layer 16a in the direction of the length L of the light-emitting element LD.

The first layer 16a may be in direct contact with the upper surface 16b_2 of the second layer 16b. The first layer 16a may be made of a transparent conductive material having a transmittance (or light transmittance) of a certain or predetermined level or more. As an example, the first layer 16a may include indium tin oxide (ITO), indium zinc oxide (IZO), indium tin zinc oxide (ITZO), fluorine doped tin oxide (FTO), fluorine doped zinc oxide, or the like. According to embodiments, the first layer 16a may include a metal in the form of a thin film. The metal may include gold (Au) or the like. The first layer 16a may include a lower surface 16a_1 in contact with the second layer 16b and an upper surface 16a_2 externally exposed in the direction of the length L of the light-emitting element LD. In an embodiment, the upper surface 16a_2 of the first layer 16a may be the second end portion EP2 (or upper end portion) of the light-emitting element LD.

Figure 4A:
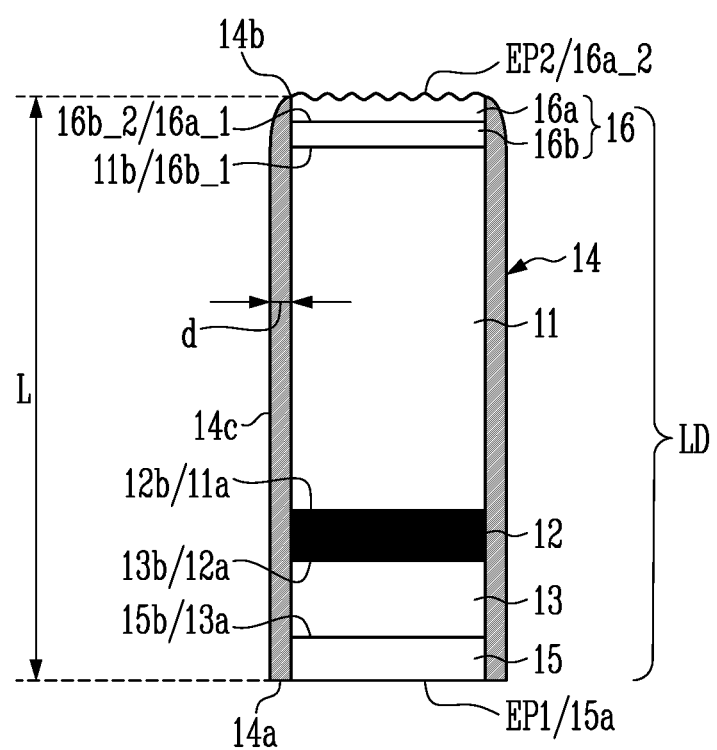
Figure 4B:
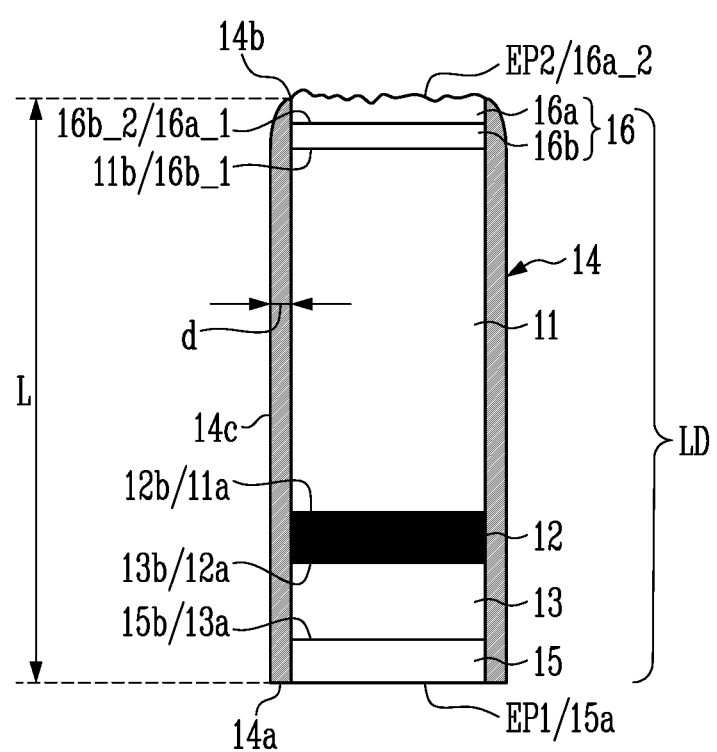

The upper surface 16a_2 of the first layer 16a may have an overall uniform (or substantially uniform) surface, for example, a smooth surface. However, the embodiments are not limited thereto, and according to embodiments, as illustrated in FIG. 4A, the upper surface 16a_2 of the first layer 16a may have surface roughness so as to include an uneven pattern having overall or substantially uniform (or substantially regular) periodicity. In addition, according to another embodiment, as illustrated in FIG. 4B, the upper surface 16a_2 of the first layer 16a may have surface roughness so as to include an uneven pattern having an overall or substantially non-uniform (or substantially irregular) shape. As described above, when the upper surface 16a_2 of the first layer 16a includes the uneven pattern having the uniform (or regular) periodicity or the uneven pattern having the non-uniform (or irregular) shape, light emitted from the active layer 12 may be diffusely reflected so that extraction efficiency of light may be further improved.

FIGS. 1 to 4B, for convenience, the first layer 16a and the second layer 16b are illustrated as having the same thickness in the direction of the length L of the light-emitting element LD, but the embodiments are not limited thereto. According to embodiments, the second layer 16b may be thicker than the first layer 16a in the direction of the length L of the light-emitting element LD. As described above, since the second layer 16b corresponds to the ohmic contact electrode in direct contact with the first semiconductor layer 11, the second layer 16b may be deposited in the form of a thin film for smooth ohmic contact with the first semiconductor layer 11. The second layer 16b may be designed to be thinner than the first layer 16a in the direction of the length L of the light-emitting element LD, but the embodiments are not limited thereto.

In an embodiment, the light-emitting stack pattern 10 may be provided and/or formed to have a shape corresponding to a shape of the light-emitting element LD. For example, when the light-emitting element LD is provided and/or formed to have a cylindrical shape, the light-emitting stack pattern 10 may also be provided and/or formed to have a cylindrical shape. When the light-emitting stack pattern 10 has a cylindrical shape, each of the second electrode 15, the second semiconductor layer 13, the active layer 12, the first semiconductor layer 11, and the first electrode 16 may have a cylindrical shape.

In the direction of the length L of the light-emitting element LD, the second electrode 15 electrically connected to the second semiconductor layer 13 may be disposed at the first end portion EP1 (or lower end portion) of the light-emitting element LD, and the first electrode 16 electrically connected to the first semiconductor layer 11 may be disposed at the second end portion EP2 (or upper end portion) of the light-emitting element LD. The light-emitting element LD may include the lower surface 15a of the second electrode 15 and the upper surface 16a_2 of the first layer 16a of the first electrode 16, which are disposed at both end portions EP1 and EP2 of the light-emitting element LD and are externally exposed. The lower surface 15a of the second electrode 15 and the upper surface 16a_2 of the first layer 16a may be surfaces (for example, outer surfaces) which are externally exposed to be in contact with external conductive materials, for example, contact electrodes and to be electrically connected to the contact electrodes.

When the light-emitting stack pattern 10 is provided and/or formed to have the shape corresponding to the shape of the light-emitting element LD, the light-emitting stack pattern 10 may have a length that is substantially similar to or the same as the length L of the light-emitting element LD.

In an embodiment, the light-emitting element LD may further include an insulating film 14. However, according to embodiments, the insulating film 14 may also be omitted and may also be provided to cover only a portion of the light-emitting stack pattern 10.

The insulating film 14 may prevent an electrical short circuit that may occur when the active layer 12 comes into contact with conductive materials other than the first and second semiconductor layers 11 and 13. In addition, the insulating film 14 may minimize surface defects of the light-emitting element LD, thereby improving a lifespan and luminous efficiency of the light-emitting element LD. Furthermore, when a plurality of light-emitting elements LD are closely disposed, the insulating film 14 may prevent an undesired short circuit that may occur between the light-emitting elements LD. When the active layer 12 may be prevented from being short-circuited with an external conductive material, whether the insulating film 14 is provided is not limited.

The insulating film 14 may include a transparent insulating material. For example, the insulating film 14 may include at least one insulating material selected from the group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $InxO_y$:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN). However, the embodiments are not limited thereto, and various materials having insulating properties may be used as the material of the insulating film 14.

The insulating film 14 may be provided in the form of a single-film or in the form of a multi-film including at least two films.

The insulating film 14 may be formed and/or provided on an outer circumferential surface (or surface) of the light-emitting stack pattern 10 so as to surround the outer circumferential surface of the active layer 12. The insulating film 14 may further surround an outer circumferential surface of each of the second electrode 15, the second semiconductor layer 13, the first semiconductor layer 11, and the first electrode 16. For convenience, FIG. 1 illustrates a portion of the insulating film 14 removed, actually, the second electrode 15, the second semiconductor layer 13, the active layer 12, the first semiconductor layer 11, and the first electrode 16 included in the light-emitting element LD may all be surrounded by the insulating film 14. In an embodiment, the insulating film 14 may completely surround each of the outer circumferential surface of the second electrode 15 and the outer circumferential surface of the first electrode 16, but the embodiments are not limited thereto. The insulating film 14 may surround only a portion of the outer circumferential surface of the second electrode 15 and/or only a portion of the circumferential surface of the first electrode 16.

The insulating film 14 may include a lower surface 14a parallel to the lower surface 15a of the second electrode 15 in a direction intersecting the direction of the length L of the light-emitting element LD, an upper surface 14b opposite to the lower surface 14a in the direction of the length L, and a side surface 14c surrounding the outer circumferential surface of the light-emitting stack pattern 10. The lower surface 14a of the insulating film 14, the upper surface 14b of the insulating film 14, and the side surface 14c of the insulating film 14 may be consecutively connected to each other. Here, the upper surface 14b of the insulating film 14 may be defined as a virtual surface including an upper circumference of the insulating film 14, and the lower surface 14a of the insulating film 14 may be defined as a virtual surface including a lower circumference of the insulating film 14.

The lower surface 14a of the insulating film 14 may be disposed on the same surface (or the same line) as the lower surface 15a of the second electrode 15, and the upper surface 14b of the insulating film 14 may be disposed on the same surface (or the same line) as the upper surface 16a_2 of the first layer 16a of the first electrode 16. The lower surface 14a of the insulating film 14 and the lower surface 15a of the second electrode 15 do not necessarily have to be disposed on the same surface (or the same line) and may be disposed on different surfaces (or different lines) according to embodiments. The upper surface 14b of the insulating film 14 and the upper surface 16a_2 of the first layer 16a do not necessarily have to be disposed on the same surface (or the same line) and may also be disposed on different surfaces (or different lines) according to embodiments. As an example, as illustrated in FIG. 3, the upper surface 14b of the insulating film 14 may be disposed on a different surface (or different line) from the upper surface 16a_2 of the first layer 16a to externally expose a portion of the first layer 16a, for example, a side surface thereof. The insulating film 14 may surround a portion of the outer circumferential surface of the first electrode 16 to expose a portion of the first electrode 16. When a portion of the first layer 16a is not covered by the insulating film 14 and is externally exposed, a contact area between a conductive material, for example, a contact electrode (not illustrated) and the first layer 16a may be increased. Accordingly, the contact electrode and the first layer 16a may be electrically and/or physically connected more stably.

The insulating film 14 may be formed by forming an insulating material layer (not illustrated) on the outer circumferential surface (or surface) of the light-emitting stack pattern 10 and then removing a portion of the insulating material layer through an etching process. The above-described etching process may be a dry etching method which is an anisotropic etching method. Due to such an etching process, a portion of the side surface 14c of the insulating film 14, which is in contact with the upper surface 14b, may be provided in a shape having a certain or predetermined radius of curvature or a shape having a certain or predetermined gradient. In this region of the insulating film corresponding to the second end portion EP2 (upper end portion), the thickness d of the side surface 14c of the insulating film 14 may gradually decrease upward in the direction of the length L of the light-emitting element LD. The region of the insulating film 14 corresponding to the second end portion EP2 may have a different shape from the region corresponding to the first end portion (lower end portion) which is not provided to have a curvature or gradient.

The second electrode 15, the second semiconductor layer 13, the active layer 12, the first semiconductor layer 11, and the first electrode 16, which are stacked in the direction of the length L of the light-emitting element LD, may have different thicknesses, but the embodiments are not limited thereto.

The light-emitting element LD may be grown and manufactured on a substrate (not illustrated) for epitaxial growth.

A light-emitting element grown on a substrate may be separated from the substrate using a physical method. The separation surface of the light-emitting element may not be constant and may have different surface roughness depending on the regions.

Here, the term "constant" may mean that the size, shape, range, and time of something are uniform or substantially uniform. The term "constant" may also mean that a surface of an object is constantly even, uniform, smooth, or flat. The term "constant" may also mean that a surface of an object is approximately or averagely even, uniform, smooth, or flat. However, the definition of term "constant" is not limited thereto in this disclosure.

In case that a substrate and a light-emitting element grown on the substrate are separated using a physical method, a surface of the light-emitting element separated from the substrate may not have approximately or averagely constant surface roughness and may have a different surface roughness for each region. As an example, in the case of a physical separation method of separating the light-emitting element from the substrate by applying a physical force or impact to the light-emitting element and the substrate, stresses on the substrate and the light-emitting elements may be different according to the intensity (or magnitude) of the applied force at each position, and thus, at least one region of the surface of the light-emitting element separated from the substrate may form uneven steps. Due to the uneven steps, unlike the remaining region of the surface, at least one region of the surface of the light-emitting element may not be constant, for example, may have a rough or uneven shape or non-constant (or non-uniform) surface roughness. The surface roughness of at least one region of the surface of the light-emitting element may be different from that of the remaining region of the surface of the light-emitting element such that the surface of the light-emitting element may have various shapes (or surfaces) without uniformity. The surface of the light-emitting element separated from the substrate and the other surface of the light-emitting element opposite to the surface may have different surface roughness. When one surface of the light-emitting element has a different surface roughness from the other surface, contact defects may occur when the light-emitting element comes into contact with a contact electrode.

In the light-emitting element LD according to the embodiments of this disclosure, in order to mitigate or avoid such uneven and nonuniform surfaces, the light-emitting element LD may be separated using a laser lift-off (LLO) method and/or a chemical lift-off (CLO) method, thereby allowing the first end portion EP1 (or lower end portion) and the second end portion EP2 (or the upper end portion) of the light-emitting element LD to have an approximately (or averagely) constant surface roughness. This will be described below with reference to FIGS. 5 to 20.

The light-emitting element LD may be used as a light-emitting source (or light source) of various display devices. The light-emitting element LD may be manufactured through a surface treatment process. For example, when the plurality of light-emitting elements LD are mixed in a flowable solution (or solvent) and supplied to each pixel area (for example, an emission area of each pixel or an emission area of each subpixel), the light-emitting elements LD may be surface-treated so as to be uniformly sprayed without being non-uniformly aggregated in the solution.

A light-emitting unit (or light-emitting device) including the light-emitting element LD may be used in various types of electronic devices, such as display devices, which require a light source. For example, when the light-emitting elements LD are disposed in a pixel area of each pixel of a display panel, the light-emitting elements LD may be used as light sources for each pixel. However, the application field of the light-emitting element LD is not limited to these examples. For example, the light-emitting element LD may be used in other types of electronic devices, such as lighting devices, which require a light source.

Figure 2:
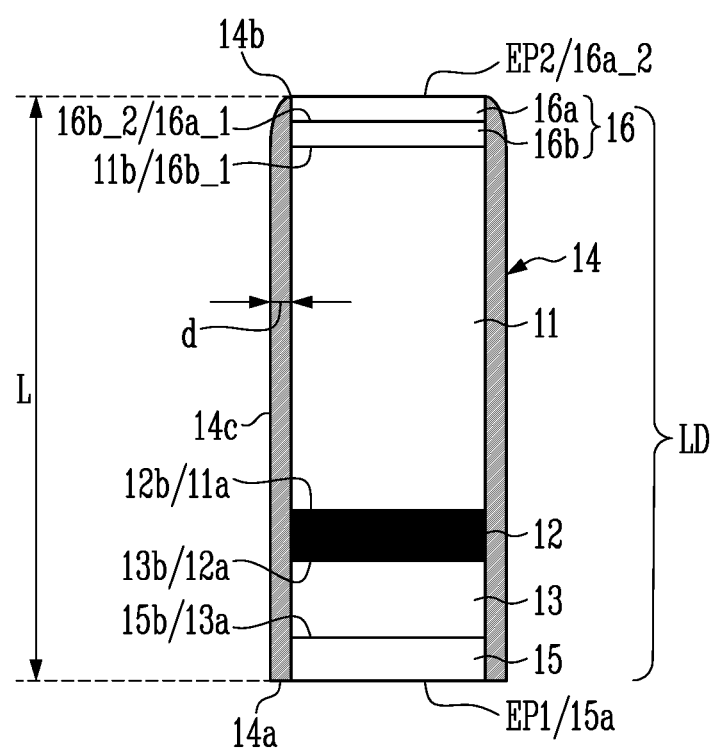

FIGS. 5 to 20 are cross-sectional views sequentially illustrating a method of manufacturing the light-emitting element of FIGS. 1 and 2.

Figure 5:
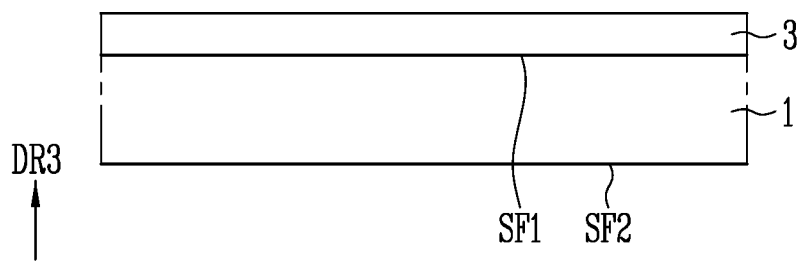
FIGS. 5 to 20 are cross-sectional views sequentially illustrating a method of manufacturing the light-emitting element of FIGS. 1 and 2.
Figure 6:
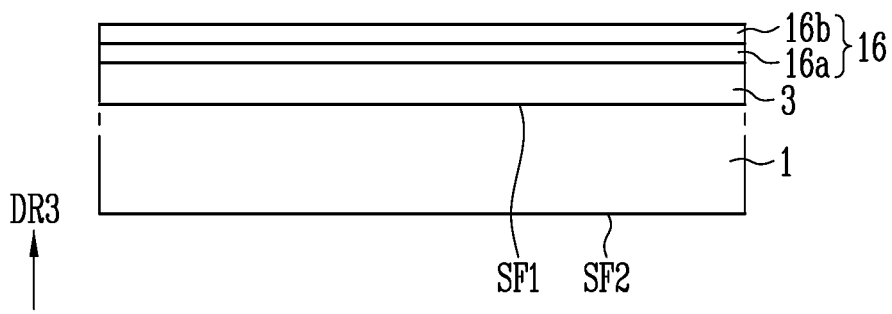
Figure 7:
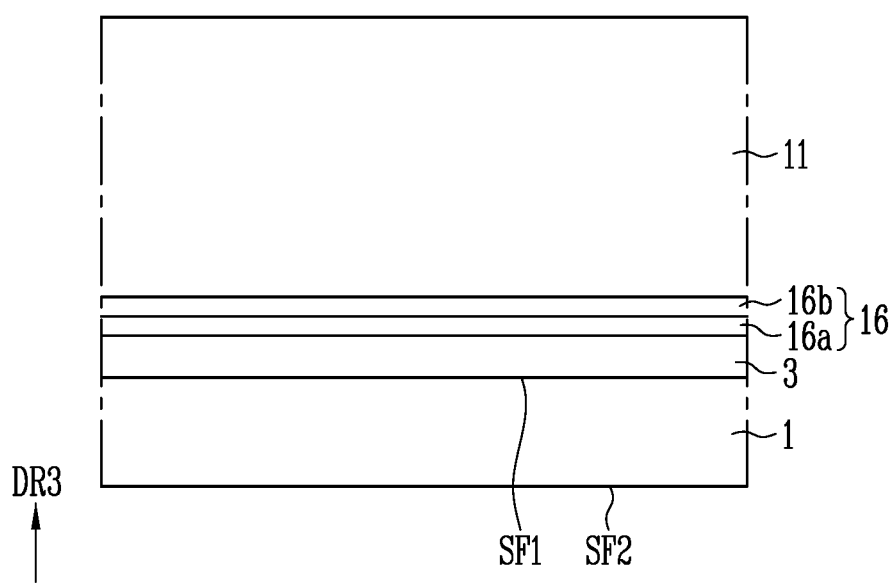
Figure 8:
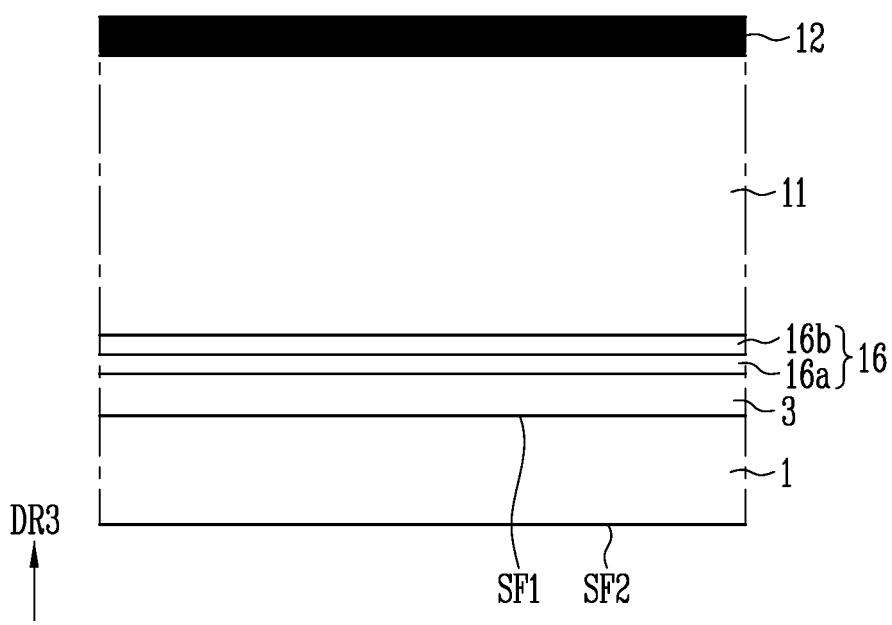
Figure 9:
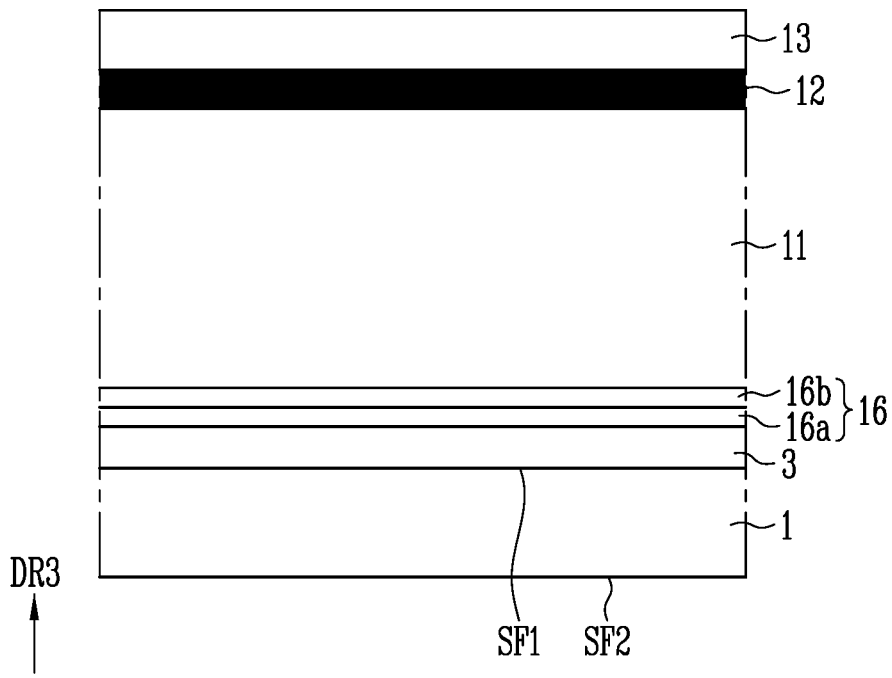
Figure 10:
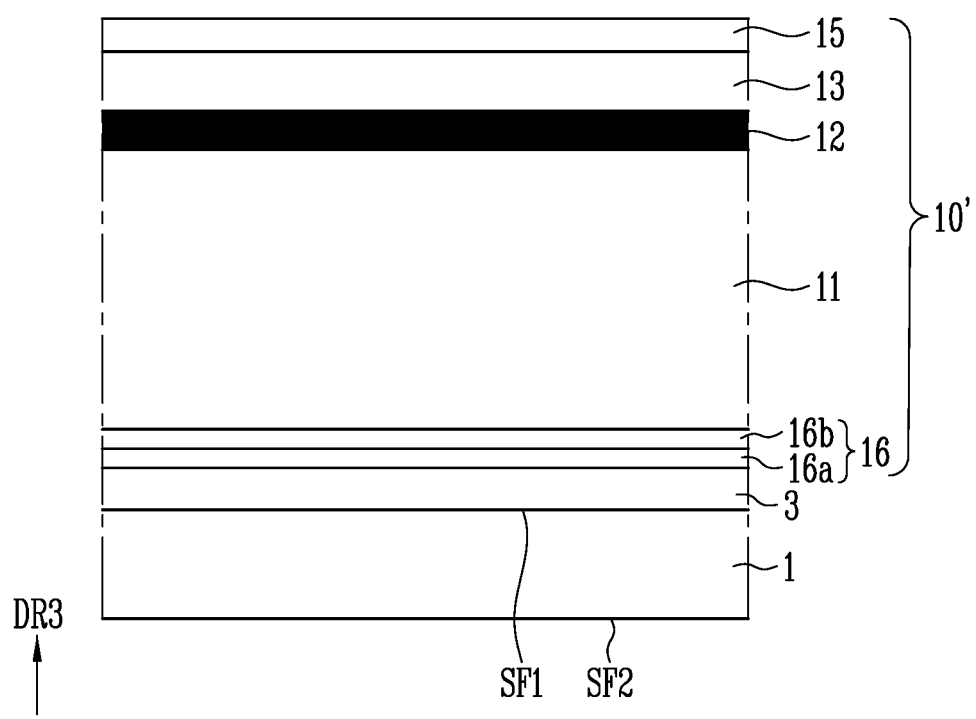
Figure 11:
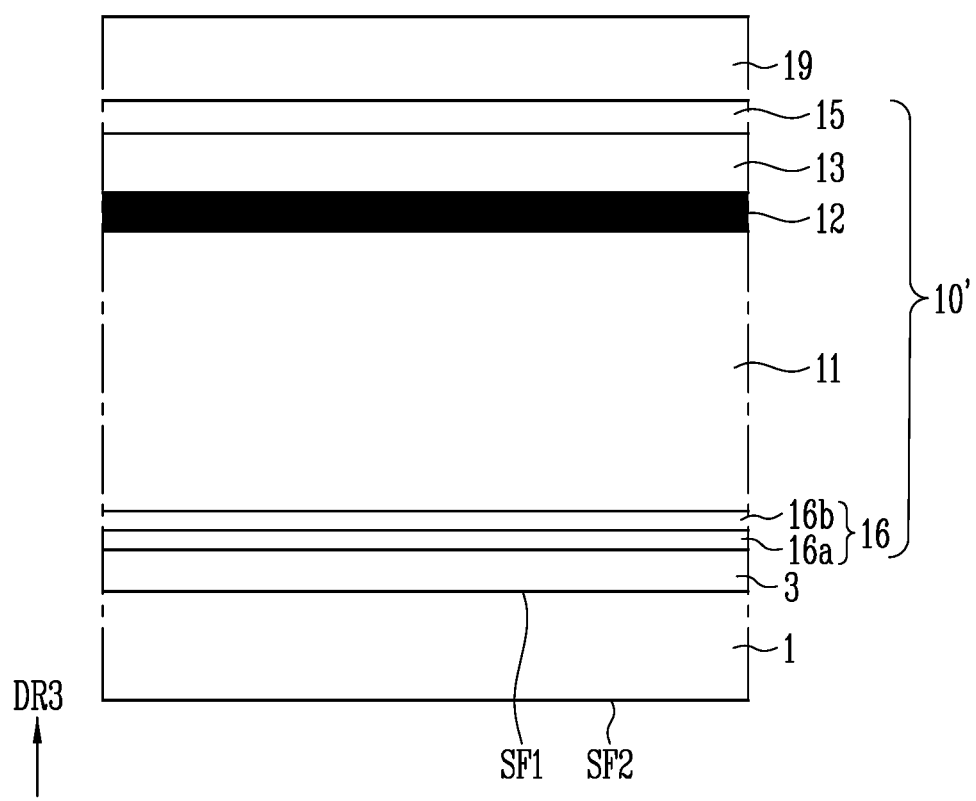
Figure 12:
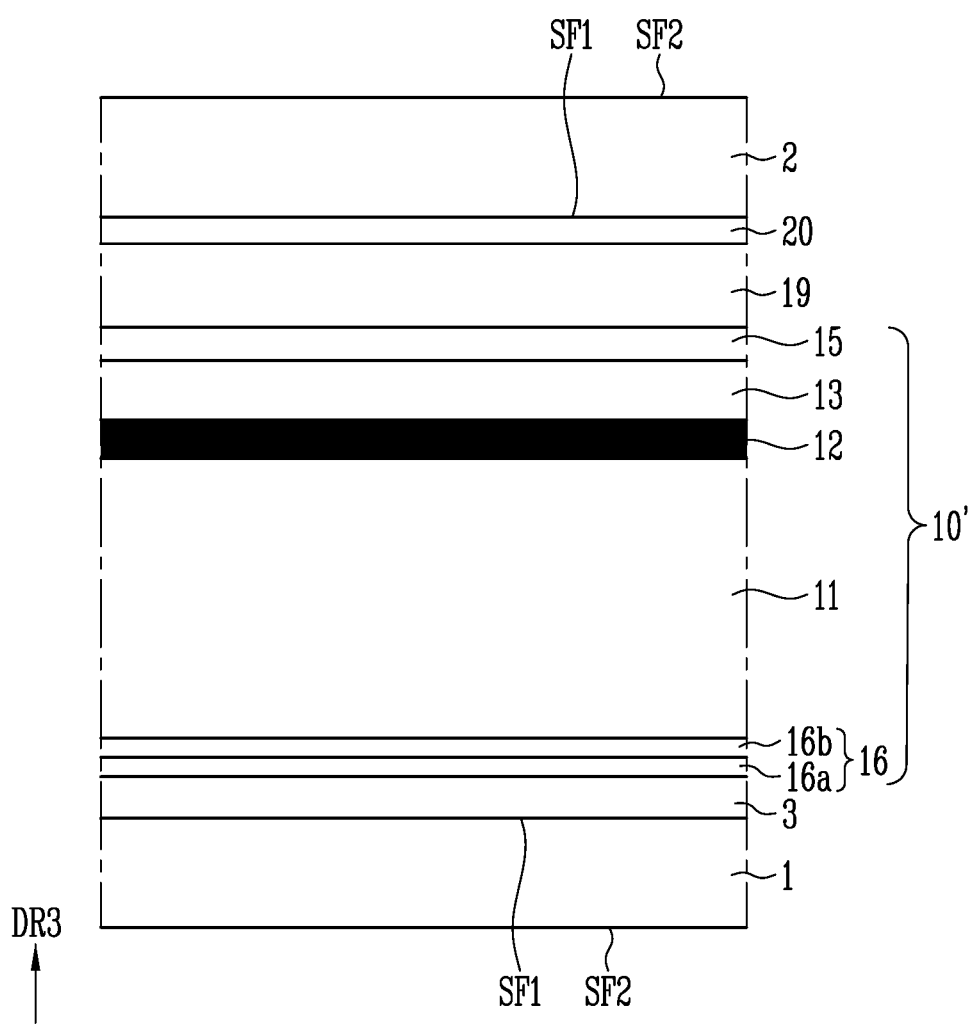
Figure 13:
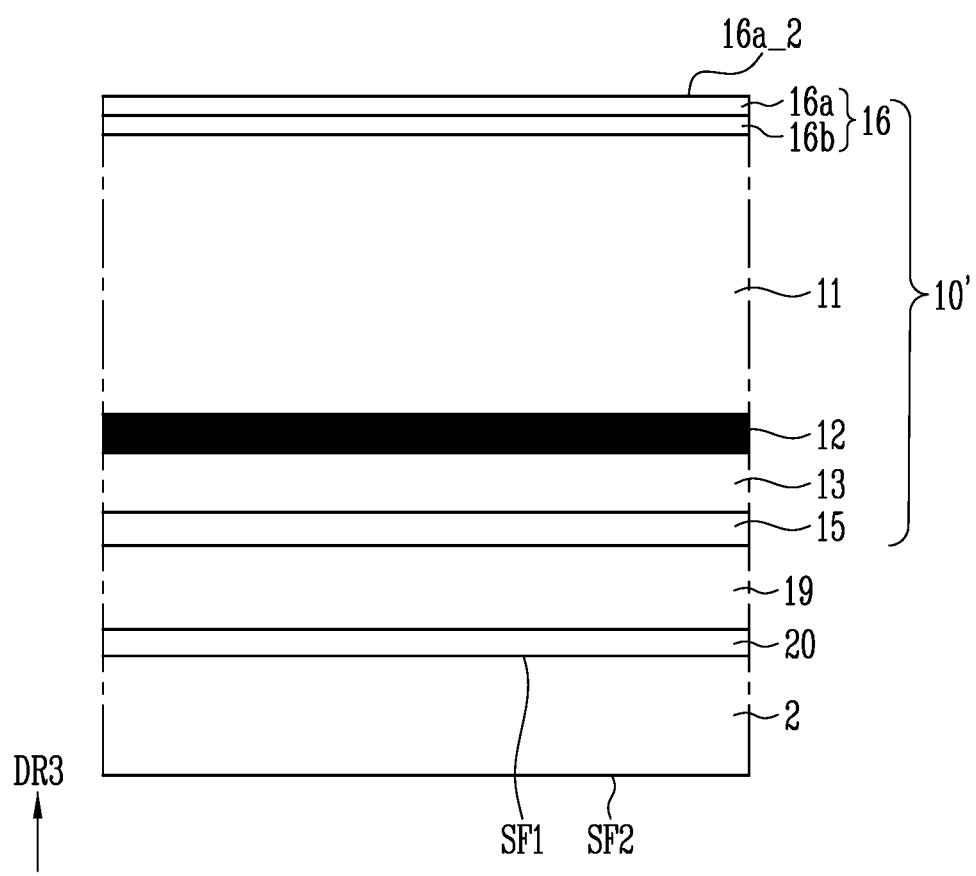
Figure 14:
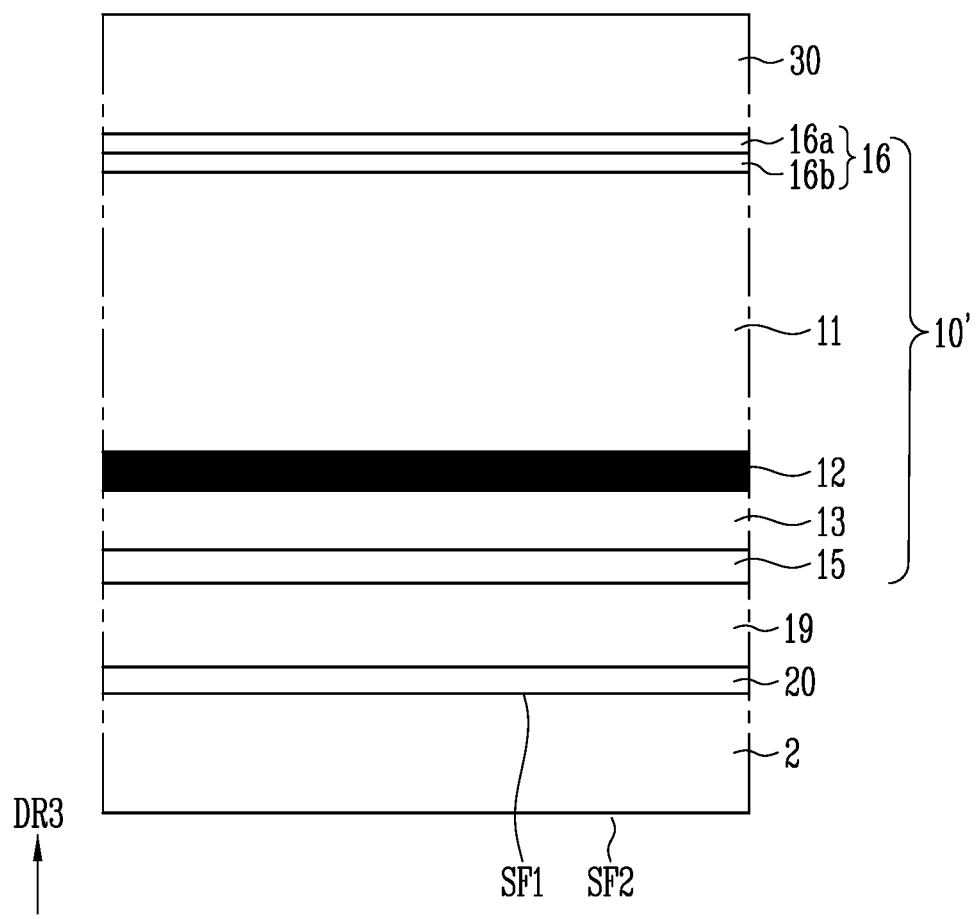
Figure 15:
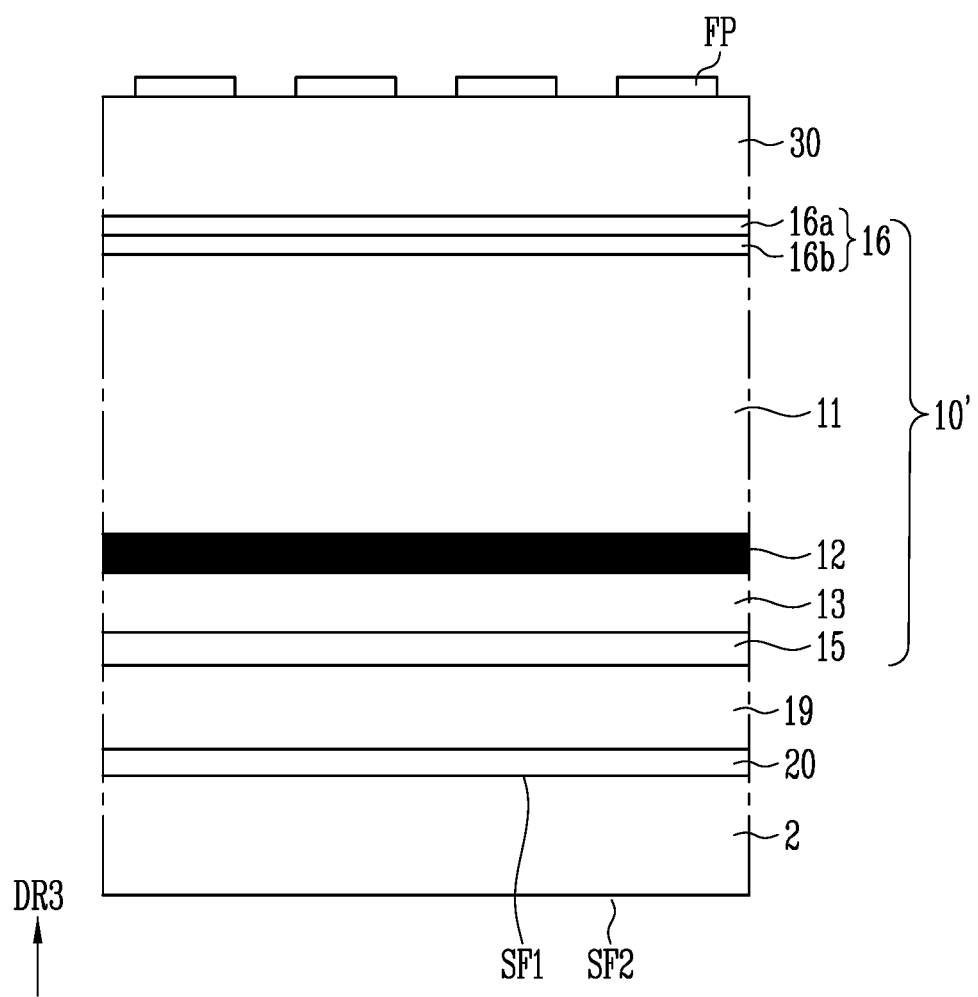
Figure 16:
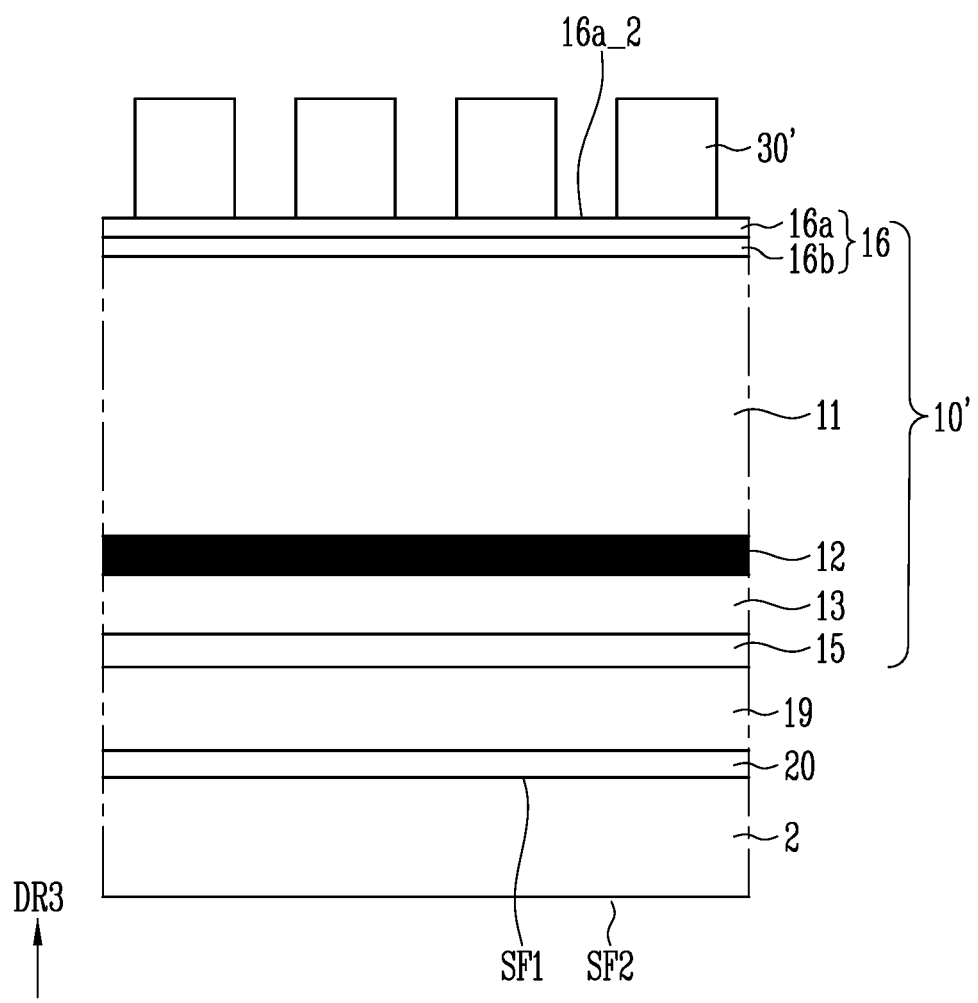
Figure 17:
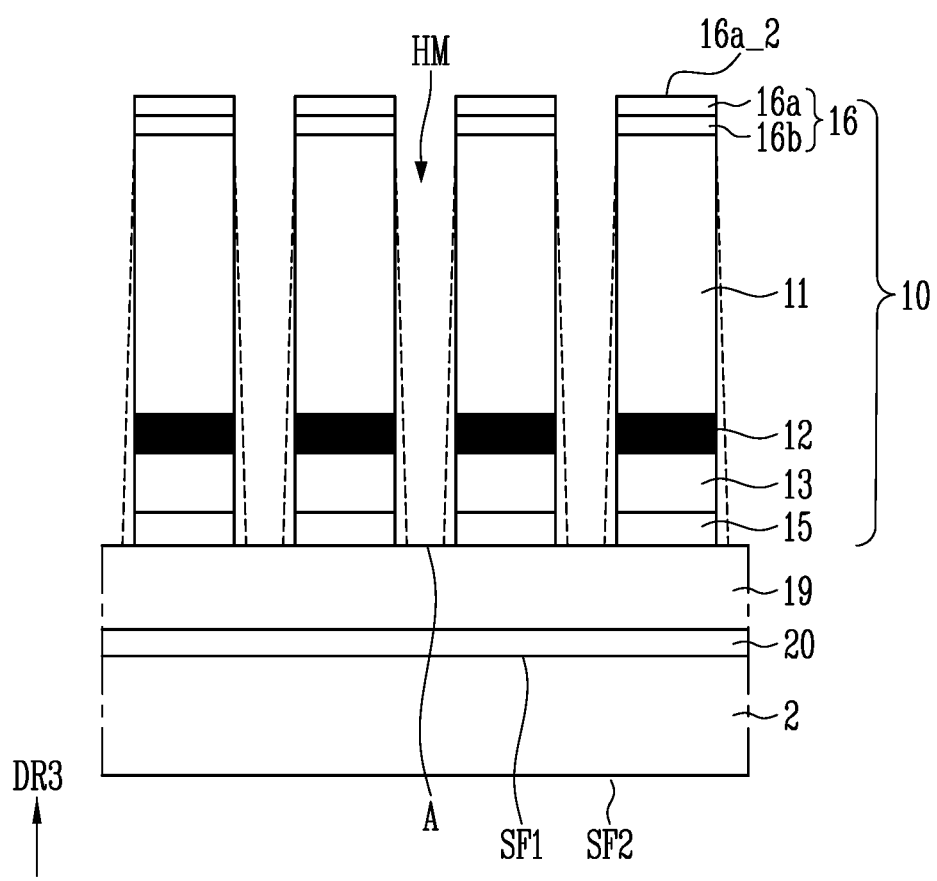
Figure 18:
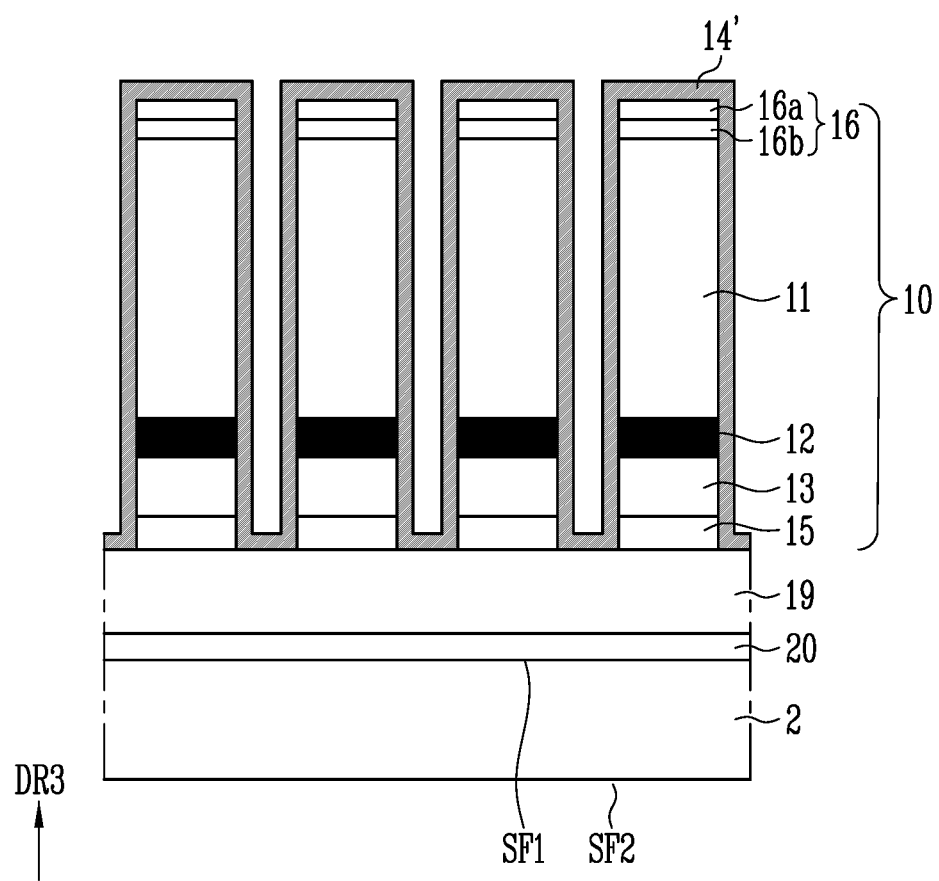
Figure 19:
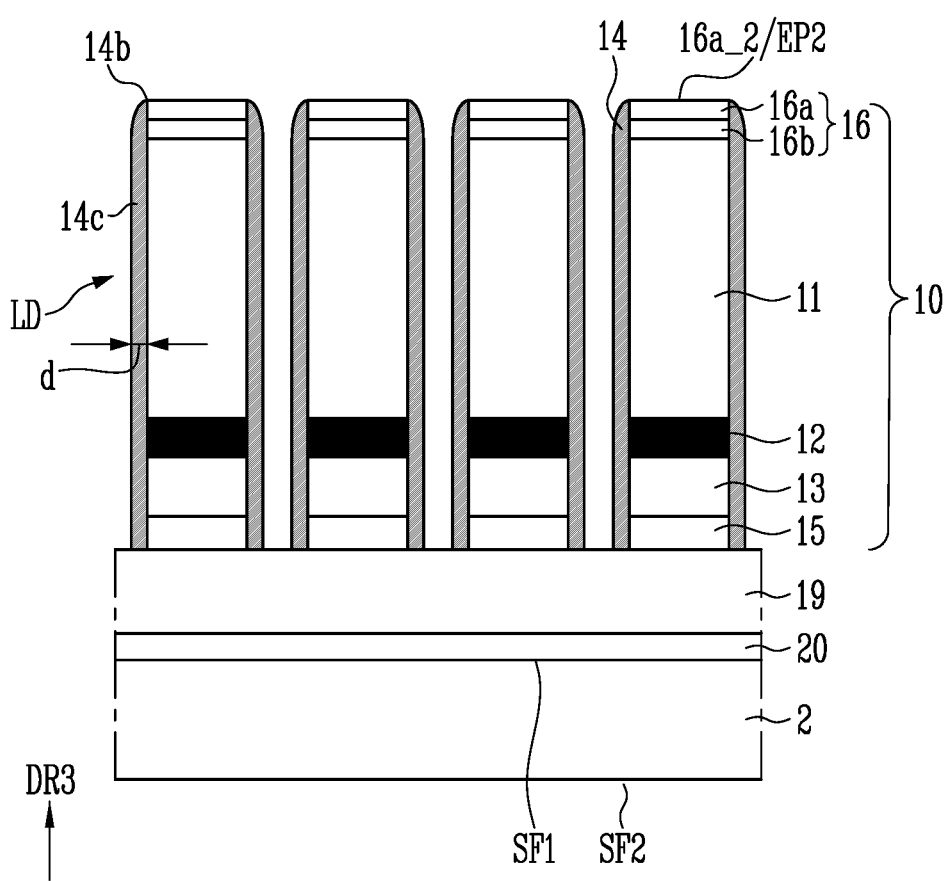

Referring to FIGS. 1, 2, and 5, a first substrate 1 configured to support a light-emitting element LD is prepared.

The first substrate 1 may be a GaAs, GaP, or InP substrate. The first substrate 1 may be a wafer (or growth substrate) for epitaxial growth. The first substrate 1 may include a ZnO substrate including a GaAs layer on a surface thereof. Furthermore, a Ge substrate including a GaAs layer on a surface thereof and a Si substrate including a GaAs layer on a Si wafer with a buffer layer interposed therebetween may also be applied.

As for the first substrate 1, as an example, a commercially available single crystal substrate may be used. As long as the selectivity for manufacturing the light-emitting element LD is satisfied and epitaxial growth may be smoothly performed, the material for the first substrate 1 is not limited thereto.

A surface of the first substrate 1, upon which epitaxial growth is to be performed, may be flat. The size and diameter of the first substrate 1 may vary according to the product to which the first substrate 1 is applied, and the first substrate 1 may be manufactured in a form capable of reducing a warpage caused by a stacked structure due to epitaxial growth. The shape of the first substrate 1 is not limited to a circular shape but may be a polygonal shape such as a rectangular shape.

A sacrificial layer 3 is formed on a first surface SF1 (or upper surface) of the first substrate 1. In a process of manufacturing the light-emitting element LD, the sacrificial layer 3 may be disposed between the light-emitting element LD and the first substrate 1 to physically separate the light-emitting element LD and the first substrate 1. As illustrated in FIG. 5, a second surface SF2 (or rear surface) opposite to the first surface SF1 of the first substrate 1 may face downward in a thickness direction DR3 of the first substrate 1 (hereinafter, referred to as a "third direction").

The sacrificial layer 3 may include various types of structures and may Include a single-layered structure or a multi-layered structure. The sacrificial layer 3 may be a layer that is removed in a final manufacturing process of the light-emitting element LD. By removing the sacrificial layer 3, layers disposed on and below the sacrificial layer 3 may be separated.

The sacrificial layer 3 may be made of GaAs, AlAs, or AlGaAs.

Referring to FIGS. 1, 2, 5, and 6, a first electrode 16 is formed on the sacrificial layer 3.

Specifically, a first layer 16*a* is formed on the sacrificial layer 3, and a second layer 16*b* is formed on the first layer 16*a*.

The first layer 16*a* may include at least one material selected from indium tin oxide (ITO), indium zinc oxide (IZO), indium tin zinc oxide (ITZO), fluorine doped tin oxide (FTO), and fluorine doped zinc oxide. According to embodiments, the first layer 16*a* may include a metal in the form of a thin film. The first layer 16*a* may improve contact reliability between a first semiconductor layer 11 formed through a process to be described below, and a contact electrode (not illustrated). The first layer 16*a* may prevent the second layer 16*b* from being externally exposed by a laser irradiated when the first substrate 1 is removed. Since the first layer 16*a* is made of a transparent conductive oxide and is in ohmic contact with the first semiconductor layer 11, electrical characteristics and luminous efficiency of the light-emitting element LD can be further improved. The above-described first layer 16*a* may be a light-transmitting conductive layer.

The second layer 16*b* may be made of a conductive material having a transmittance of a certain or predetermined level or more, such as indium (In), titanium (Ti), chromium (Cr), or nickel (Ni). According to embodiments, the second layer 16*b* may be made of a transparent conductive oxide. The second layer 16*b* may be an ohmic contact layer which is disposed between the first semiconductor layer 11 and the first layer 16*a* and is in direct ohmic contact with the first semiconductor layer 11.

In an embodiment, the first layer 16*a* and the second layer 16*b* may include different materials.

The first electrode 16 including the above-described first layer 16*a* and second layer 16*b* may be an ohmic contact electrode. As an example, the first electrode 16 may be in ohmic contact with the first semiconductor layer 11. However, the embodiments are not limited thereto, and according to embodiments, the first electrode 16 may be a Schottky contact electrode.

The first electrode 16 may be deposited on the sacrificial layer 3 through a sputtering method or the like. The embodiments of the method for forming the first layer 16*a* and the second layer 16*b* on the sacrificial layer 3 are not limited thereto, and other typical deposition method or the like may be applied.

Referring to FIGS. 1, 2, and 5 to 7, the first semiconductor layer 11 is formed on the first electrode 16.

The first semiconductor layer 11 may be formed through epitaxial growth and formed through a metal-organic chemical vapor deposition (MOCVD) method, a molecular beam epitaxy (MBE) method, a vapor phase epitaxy (VPE) method, a liquid phase epitaxy (LPE) method, or the like. According to embodiments, a buffer layer or an additional semiconductor layer such as an undoped semiconductor layer for improving crystallinity may be further formed between the first semiconductor layer 11 and the first electrode 16.

The first semiconductor layer 11 may include a group III (Ga, Al, or In)-V (P or As) semiconductor material and may include a semiconductor layer doped with a first conductive type dopant (n-type dopant) such as Si, Ge, or Sn. For example, the first semiconductor layer 11 may include at least one semiconductor material selected from GaP, GaAs, GaInP, and AlGaInP doped with Si. The first semiconductor layer 11 may include at least one n-type semiconductor layer.

In an embodiment, the first semiconductor layer 11 may include a gallium nitride (GaN) semiconductor material doped with the first conductive type dopant (or n-type dopant). In case that the first semiconductor layer 11 includes the gallium nitride semiconductor material, the first semiconductor layer 11 may include an N-face polarity region and a Ga-face polarity region. According to embodiments, the first semiconductor layer 11 may have an N-face polarity in which N atoms are arranged on a top layer (exposed surface) or a Ga-face polarity in which Ga atoms are arranged on a top layer (exposed surface).

Referring to FIGS. 1, 2, and 5 to 8, an active layer 12 is formed on the first semiconductor layer 11. The active layer 12 is a region in which electrons and holes are recombined. As electrons and holes are recombined to transition to a low energy state, the active layer 12 may emit light having a corresponding wavelength. The active layer 12 may be formed on the first semiconductor layer 11 and may be formed in a single or multi-quantum well structure. The position of the active layer 12 may be changed according to the position of the light-emitting element LD.

The active layer 12 may include at least one material selected from GaInP, AlGaInP, GaAs, AlGaAs, InGaAs, InGaAsP, InP, and InAs. The active layer 12 may emit light having a wavelength of about 400 nm to about 900 nm. The active layer 12 may have a double hetero structure. According to embodiments, a cladding layer (not illustrated) doped with a conductive dopant may be further formed on a first surface 12a and/or a second surface 12b of the active layer 12. According to another embodiment, a TSBR layer may be further formed on the first surface 12a of the active layer 12.

Referring to FIGS. 1, 2, and 5 to 9, a second semiconductor layer 13 is formed on the active layer 12. The second semiconductor layer 13 may include a semiconductor layer which is a different type from the first semiconductor layer 11. The second semiconductor layer 13 may include a group III (Ga, Al, or In)-V (P or As) semiconductor material and may include a semiconductor layer doped with a second conductive type dopant (or p-type dopant) such as Mg. For example, the second semiconductor layer 13 may include at least one semiconductor material selected from GaP, GaAs, GaInP, and AlGaInP doped with Mg. That is, the second semiconductor layer 13 may include a p-type semiconductor layer.

Referring to FIGS. 1, 2, and 5 to 10, a second electrode 15 is formed on the second semiconductor layer 13. The second electrode 15 may be made from chromium (Cr), titanium (Ti), aluminum (Al), gold (Au), nickel (Ni), indium tin oxide (ITO), indium zinc oxide (IZO), indium tin zinc oxide (ITZO), an oxide or alloy of these materials, or a mixture of these materials. In an embodiment, in order to minimize a loss of light generated in the active layer 12 and externally emitted from the light-emitting element LD and improve current spreading to the second semiconductor layer 13, the second electrode 15 may be made of a transparent conductive oxide such as indium tin oxide (ITO).

The second electrode 15 may be an ohmic contact electrode. As an example, the second electrode 15 may be in ohmic contact with the second semiconductor layer 13. However, the embodiments are not limited thereto, and according to embodiments, the second electrode 15 may be a Schottky contact electrode.

The second electrode 15 may be deposited on the second semiconductor layer 13 through a sputtering method. However, since nitrogen vacancies may be formed by plasma in the light-emitting element LD including a nitride-based semiconductor, the ohmic contact characteristics of the second electrode 15 may be degraded when it is deposited through the sputtering method. Accordingly, in consideration of oxygen amounts and deposition temperatures, the second electrode 15 may be deposited directly on the second semiconductor layer 13 through an E-beam evaporation method, thereby improving the transmittance of the second electrode 15. However, the methods of forming the second electrode 15 on the second semiconductor layer 13 are not limited thereto, and other typical deposition methods or the like may be applied.

The second electrode 15 may have the same thickness as the first electrode 16 in a direction of a length L of the light-emitting element LD, but the embodiments are not limited thereto. According to embodiments, the second electrode 15 may have a thickness different from that of the first electrode 16 in the third direction DR3. In consideration of the oxygen amounts, deposition temperatures, and/or deposition times in the chamber in which a deposition process is performed when the corresponding electrode is formed, the thickness of each of the first and second electrodes 16 and 15 may be determined within a range in which the loss of light emitted from the active layer 12 is minimized.

The first electrode 16, the first semiconductor layer 11, the active layer 12, the second semiconductor layer 13, and the second electrode 15, which are stacked on the first substrate 1, may constitute a light-emitting stack 10'.

Referring to FIGS. 1, 2, and 5 to 11, a buffer layer 19 is formed on the second electrode 15. The buffer layer 19 may be an inorganic insulating film including an inorganic material. As an example, the buffer layer 19 may be an inorganic insulating film made of silicon oxide ($SiO_x$).

Referring to FIGS. 1, 2, and 5 to 12, an adhesive layer 20 (or bonding metal) for bonding to a second substrate 2 is formed on the buffer layer 19, the second substrate 2 is disposed on the adhesive layer 20, and then, the first substrate 1 and the second substrate 2 are bonded to each other.

The second substrate 2 may be a support substrate which supports the light-emitting stack 10' while a series of processes are performed. The second substrate 2 may include a rigid substrate such as a glass substrate.

The second substrate 2 may include a first surface SF1 and a second surface SF2 opposite to each other. The first surface SF1 of the second substrate 2 may be in contact with the adhesive layer 20 (or bonding metal), and the second surface SF2 of the second substrate 2 may be exposed.

Referring to FIGS. 1, 2, and 5 to 13, in order to remove the first substrate 1, the first substrate 1 is turned over such that the first surface SF1 of the first substrate 1 faces downward and the second surface SF2 of the first substrate 1 faces upward. Accordingly, the second surface SF2 of the second substrate 2 may face downward in the third direction DR3. The light-emitting stack 10' may include the second electrode 15, the second semiconductor layer 13, the active layer 12, the first semiconductor layer 11, and the first electrode 16 which are stacked on the first surface SF1 of the second substrate 2.

Subsequently, the first substrate 1 is separated from the light-emitting stack 10' through a laser lift-off (LLO) method using a laser. In case that a laser is irradiated onto the first substrate 1, the sacrificial layer 3 and the light-emitting stack 10' may be physically separated. For example, the sacrificial layer 3 may lose an adhesive function when the laser is irradiated. As the first substrate 1 is removed, the first layer 16a of the first electrode 16 may be externally exposed.

After the first substrate 1 is removed through the LLO method, the externally exposed first layer 16a of the first electrode 16 may have constant surface roughness. For example, an entire region of the first layer 16a of the first electrode 16, which is externally exposed, may approximately (or averagely) have constant surface roughness. Since the first substrate 1 and the first electrode 16 are separated by removing the sacrificial layer 3 through the LLO method without applying a physical force or impact between the first substrate 1 and the first electrode 16, an upper surface 16a_1 of the first layer 16a may have may approximately (or averagely) have constant surface roughness.

Referring to FIGS. 1, 2, and 5 to 14, a mask layer 30 is formed on the first electrode 16. The mask layer 30 may include an insulating layer (not illustrated) and a metal layer (not illustrated). The insulating layer may be formed on the first layer 16a of the first electrode 16. The insulating layer may serve as a mask for continuously etching the light-emitting stack 10'. The insulating layer may be made of an oxide or a nitride and may include, for example, silicon oxide ($SiO_x$), silicon nitride ($SiN_x$), or the like. The metal layer may include a metal such as chromium (Cr), but the embodiments are not limited thereto.

Referring to FIGS. 1, 2, and 5 to 15, one or more fine patterns FP may be formed on the mask layer 30. The fine patterns FP may be formed through a polymer layer. The fine patterns FP may be formed by forming the polymer layer on the mask layer 30 and forming patterns on the polymer layer at nanoscale to microscale intervals. The polymer layer on the mask layer 30 may be patterned through a method such as photo-lithography, electron beam lithography, or nanoimprint lithography (NIL), thereby forming the fine patterns FP at nanoscale to microscale intervals.

Referring to FIGS. 1, 2, and 5 to 16, the mask layer 30 is patterned using the fine patterns FP as a mask to form mask patterns 30'. The mask pattern 30' may be formed to have a shape corresponding to the fine pattern FP. The above-described mask pattern 30' may be used as an etching mask for forming light-emitting stack patterns 10 by etching the light-emitting stack 10'. The fine pattern FP may be removed through a typical wet etching method or dry etching method, but the embodiments are not limited thereto. The fine pattern FP may be removed through a typical removal method.

Referring to FIGS. 1, 2, and 5 to 17, an etching process using the mask patterns 30' as an etching mask is performed to etch the light-emitting stack 10' in a vertical direction, for example, in the third direction DR3 at nanoscale to microscale intervals, thereby forming the light-emitting stack patterns 10.

In the above-described etching process, a region of the light-emitting stack 10', which does not correspond to the mask pattern 30', may be etched to form a groove HM exposing a region A of the buffer layer 19. A region of the light-emitting stack 10', which corresponds to the mask pattern 30', may not be etched.

The groove HM is recessed from an upper surface 16$a$_2 of the first layer 16$a$ of each light-emitting stack pattern 10 to region A of the buffer layer 19 in the third direction DR3.

A dry etching method such as a reactive ion etching (RIE) method, a reactive ion beam etching (RIBE) method, or an inductively coupled plasma reactive ion etching (ICP-RIE) method may be used as an etching method of forming the light-emitting stack patterns 10. Unlike wet etching methods, the dry etching methods may allow unidirectional etching and thus may be suitable for forming the light-emitting stack patterns 10. In wet etching methods, isotropic etching may be performed, and thus, etching may be performed in all directions. Unlike wet etching methods, in dry etching methods, etching may be mainly performed in a depth direction to form a groove HM that may have a desired size, depth, or the like. According to embodiments, the etching for the light-emitting stack patterns 10 may be performed through a combination of dry etching and wet etching. For example, after etching is performed in a depth direction through dry etching, the sidewalls may be further etched to be perpendicular to the surface through an isotropic wet etching.

In an embodiment, each of the light-emitting stack patterns 10 may have a size ranging from a nanoscale to a microscale.

After the above-described etching process is performed, residues remaining on the light-emitting stack patterns 10, for example, the mask patterns 30', may be removed through a typical wet etching or dry etching method, but the embodiments are not limited thereto. As an example, the mask pattern 30' may be removed through a typical removal method.

Referring to FIGS. 1, 2, and 5 to 18, an insulating material layer 14' is formed on the light-emitting stack patterns 10 and region A of the buffer layer 19. The insulating material layer 14' may include an upper insulating material layer, a side insulating material layer, and a lower insulating material layer. The upper insulating material layer may completely cover an upper surface of each of the light-emitting stack patterns 10. Here, the upper surface of each of the light-emitting stack patterns 10 may be the upper surface 16$a$_2 of the first layer 16$a$. That is, the upper insulating material layer may completely cover the upper surface 16$a$_2 of the first layer 16$a$ of each of the light-emitting stack patterns 10. The side insulating material layer may completely cover a side surface of each of the light-emitting stack patterns 10. The lower insulating material layer may completely cover region A of the buffer layer 19 exposed by the groove HM.

The upper insulating material layer, the side insulating material layer, and the lower insulating material layer may be consecutively connected to each other on the light-emitting stack patterns 10.

As a method of forming the insulating material layer 14', a method of applying an insulating material on the light-emitting stack patterns 10 disposed on the second substrate 2 may be used, but the embodiments are not limited thereto. The insulating material layer 14' may include a transparent insulating material. For example, the insulating material layer 14' may include at least one insulating material selected from the group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), magnesium oxide (MgO), zinc oxide (ZnO), ruthenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, $In_xO_y$:H, niobium oxide ($Nb_xO_y$), magnesium fluoride ($MgF_x$), aluminum fluoride ($AlF_x$), an alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN).

As an example, if the insulating material layer 14' includes aluminum oxide ($AlO_x$), the insulating material layer 14' may be formed through an atomic layer deposition (ALD) method. The insulating material layer 14' may have a thickness of about 30 nm to about 150 nm, but the embodiments are not limited thereto.

Referring to FIGS. 1, 2, and 5 to 19, an etching process may be performed to remove a portion of the insulating material layer 14', thereby forming an insulating film 14. The above-described etching process may be a dry etching method.

Through the above-described etching process, the upper insulating material layer and the lower insulating material layer may be removed, and thus, the insulating film 14 including only the side insulating material layer covering the side surface of each of the light-emitting stack patterns 10 may be finally formed. An edge of the upper insulating material layer of the insulating material layer 14' may be over-etched compared with other regions of the insulating material layer 14'. By over-etching, the portion of a side surface 14$c$ of the insulating film 14, which is in contact with an upper surface 14$b$, may be shaped to have a certain or predetermined radius of curvature or to have a certain or predetermined slope. A region of the side surface 14$c$ of the insulating film 14 in contact with the upper surface 14$b$ and corresponding to the outer circumferential surface of the first electrode, may be shaped such that the thickness d gradually decreases upward in the third direction DR3. Other regions such as the region in contact with a lower surface 14$a$ at the lower side of each of the light-emitting stack patterns 10 may not be over-etched in the above-described etching process. Thus, the other regions may not be shaped to have a radius of curvature and may be shaped to have a uniform thickness d. Accordingly, the region of the insulating film 14 in contact with the upper surface 14b (and corresponding to the second end portion EP2) and the region in contact with the lower surface 14a (corresponding to the first end portion EP1) may be provided in different shapes.

Through the above-described etching process, the upper insulating material layer may be removed to expose the upper surface 16a_2 of the first layer 16a. The upper surface 14b of the insulating film 14 may be provided and/or formed on the same surface (or the same line) as the upper surface 16a_2 of the first layer 16a. In addition, through the above-described etching process, the lower insulating material layer may be removed to expose a region of the buffer layer 19.

Through the above-described etching process, light-emitting elements LD including the light-emitting stack patterns 10 and the insulating film 14 surrounding an outer circumferential surface of each of the light-emitting stack patterns 10 may be finally formed. The exposed upper surface 16a_2 of the first layer 16a may become a second end portion EP2 (or upper surface) of each of the light-emitting elements LD.

Figure 20:
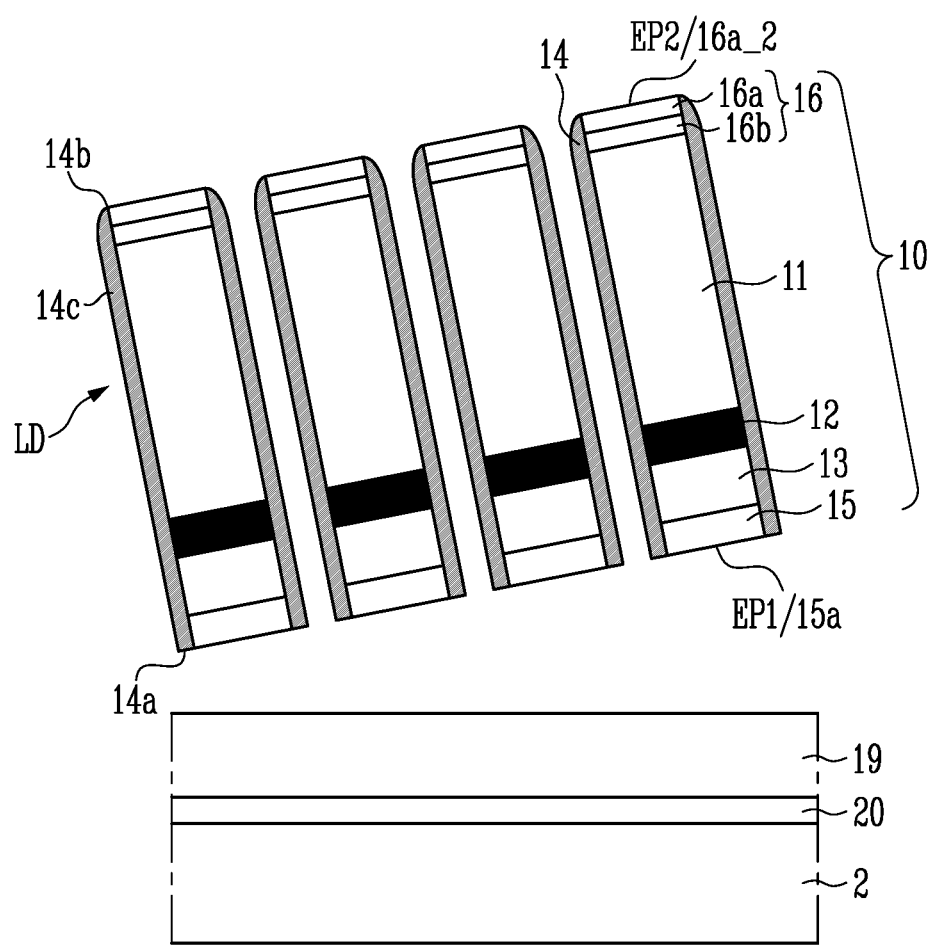

Referring to FIGS. 1 to 20, the buffer layer 19 is removed to separate the light-emitting elements LD from the second substrate 2. The buffer layer 19 may be dissolved by an etching solution such as a hydrofluoric acid (HF). As illustrated in FIG. 20, the light-emitting elements LD may be separated from the second substrate 2 through a CLO method. As the light-emitting elements LD are separated from the second substrate 2, the lower surface 15a of the second electrode 15 of each of the light-emitting elements LD may be exposed. The exposed lower surface 15a of the second electrode 15 may become the first end portion EP1 (or lower surface) the light-emitting elements LD.

The lower surface 15a of the second electrode 15, which is separated from the second substrate 2 and exposed through the CLO method, may approximately (or averagely) have constant surface roughness. The entire region of the lower surface 15a of the second electrode 15, which is exposed, may approximately (or averagely) have constant surface roughness. Since the second substrate 2 and the second electrode 15 are separated by dissolving the buffer layer 19 through a CLO method without applying physical force or impact to the second substrate 2 and the second electrode 15, the lower surface 15a of the second electrode 15 may have may approximately (or averagely) have constant surface roughness.

In each of the light-emitting elements LD finally manufactured through the above-described manufacturing process, each of the first and second end portions EP1 and EP2 may approximately (or averagely) have constant surface roughness in the direction of the length L of each light-emitting element LD. As an example, the lower surface 15a of the second electrode 15 corresponding to the first end portion EP1 of each light-emitting element LD and the upper surface 16a_2 of the first layer 16a corresponding to the second end portion EP2 of the corresponding light-emitting element LD may have a flat surface and the lower surface 15a and the upper surface 16a_2 is parallel to each other.

Since a growth substrate, i.e., the first substrate 1 and the upper surface 16a_2 of the first layer 16a are separated through the LLO method, and a support substrate, i.e., the second substrate 2 and the lower surface 15a of the second electrode 15 are separated through the CLO method, in each light-emitting element LD, surfaces (the lower surface 15a of the second electrode 15 and the upper surface 16a_2 of the first layer 16a) separated from the corresponding substrates may have a flat surface. Thus, in each light-emitting element LD, an effective contact area between the lower surface 15a of the second electrode 15 and a contact electrode (not illustrated) in contact with the lower surface 15a may be the same or substantially similar to an effective contact area between the upper surface 16a_2 of the first layer 16a and the other contact electrode (not illustrated) in contact with the upper surface 16a_2. Accordingly, contact resistance of the first end portion EP1 of the light-emitting elements LD may be the same or similar to the contact resistance of the second end portion EP2. The intensity (or amount) of light emitted from each light-emitting element LD may be uniform. Accordingly, the light-emitting elements LD may have uniform luminous efficiency.

Figure 21:
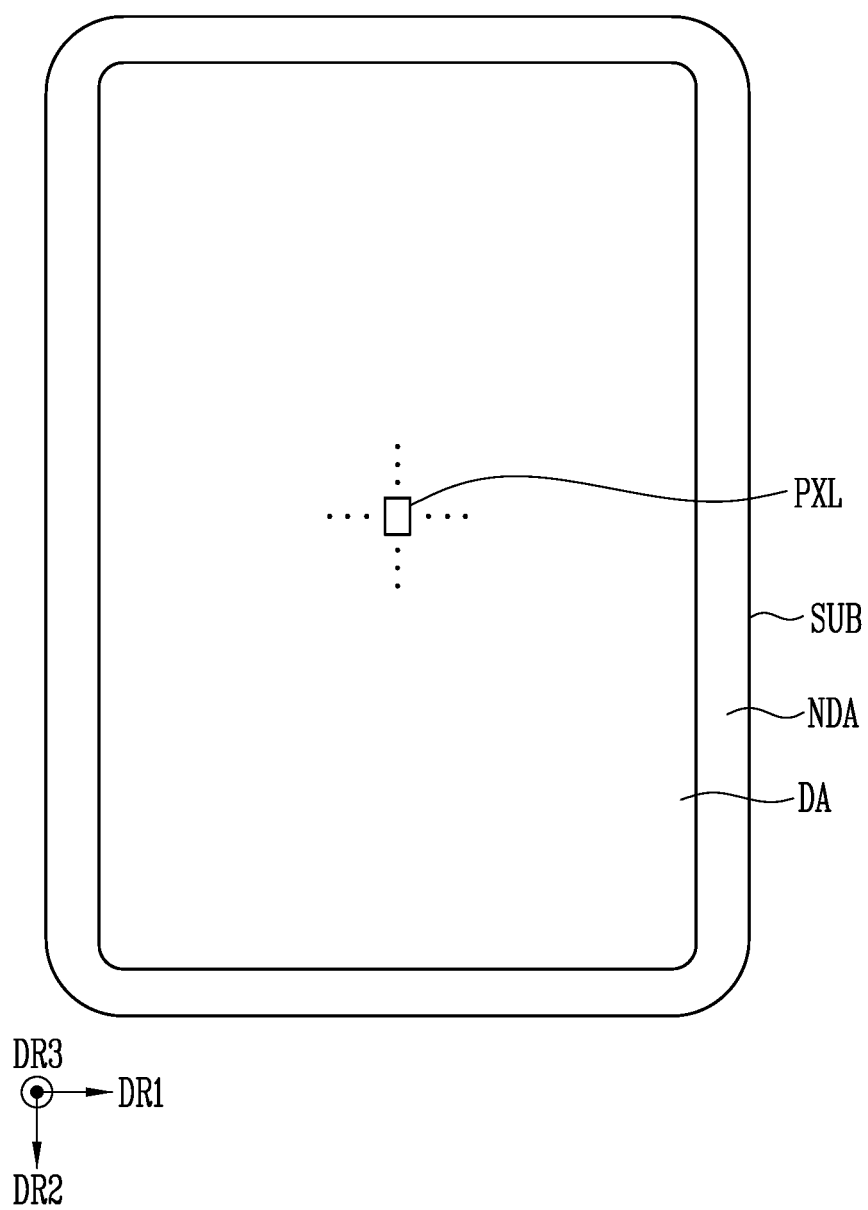
FIG. 21 illustrates a display device according to an embodiment.

FIG. 21 illustrates a display device according to an embodiment, in particular, is a schematic plan view of a display device using the light-emitting element illustrated in FIGS. 1 and 2 as a light source.

In FIG. 21, for convenience, the structure of the display device is schematically illustrated based on a display area DA in which an image is displayed.

Referring to FIGS. 1, 2, and 21, the display device according to an embodiment may include a substrate SUB, a plurality of pixels PXL which are provided on the substrate SUB and each include at least one light-emitting element LD, a driver which is provided on the substrate SUB and drives the pixels PXL, and a line portion which connects the pixels PXL and the driver.

When the display device is an electronic device, in which a display surface is applied to at least one surface thereof, such as a smartphone, a television, a tablet personal computer (PC), a mobile phone, an image phone, an e-book reader, a desktop PC, a laptop PC, a netbook computer, a workstation, a server, a personal digital assistant (PDA), a portable multimedia player (PMP), an MP3 player, a medical device, a camera, or a wearable device, the embodiments may be applied.

The display device may be classified into a passive matrix type display device or an active matrix type display device according to the method of driving the light-emitting element LD. As an example, when the display device is implemented as an active matrix type, each of the pixels PXL may include a driving transistor which controls an amount of a current supplied to the light-emitting element LD, a switching transistor which transmits a data signal to the driving transistor, and the like.

The display device may be provided in various shapes, for example, a flat rectangular plate shape having two pairs of sides parallel to each other, but the embodiments are not limited thereto. When the display device is provided in the rectangular plate shape, among the two pairs of sides, one pair of sides may be longer than the other pair of sides. For convenience, FIG. 21 illustrates a display device with a rectangular shape having a pair of long sides and a pair of short sides. The direction parallel to the long sides may be the second direction DR2, the direction parallel to the short sides may be the first direction DR1, and a direction perpendicular to the long sides and the short sides may be the third direction DR3. In the flat rectangular display device, a corner, at which a long side is in contact with (or meets) a short side, may have a round shape, but the embodiments are not limited thereto.

The substrate SUB may include a display area DA and a non-display area NDA.

The display area DA may be an area in which the pixels PXL displaying an image are provided. The non-display area NDA may be an area in which the driver for driving the pixels PXL and a portion of the line portion for connecting the pixels PXL and the driver are provided. For convenience, only one pixel PXL is illustrated in FIG. 21, but multiple pixels PXL may be substantially disposed in the display area DA of the substrate SUB.

The non-display area NDA may be provided on at least one side of the display area DA. The non-display area NDA may surround a periphery (or edge) of the display area DA. The line portion connected to the pixels PXL and the driver connected to the line portion and configured to drive the pixels PXL may be provided in the non-display area NDA.

The line portion may electrically connect the driver and the pixels PXL. The line portion may provide a signal to each pixel PXL and may be a fan-out line portion connected to signal lines, for example, a scan line, a data line, and an emission control line. The line portion also may be a fan-out line portion connected to signal lines connected to each pixel PXL, for example, a control line and a sensing line in order to compensate for changes in electrical characteristics of each pixel PXL in real time.

The substrate SUB may include a transparent insulating material to transmit light. The substrate SUB may be a rigid substrate or a flexible substrate.

One area of the substrate SUB may be the display area DA where the pixels PXL may be disposed. The remaining area of the substrate SUB may be the non-display area NDA. As an example, the substrate SUB may include the display area DA including pixel areas in which the pixels PXL are disposed and include the non-display area NDA disposed around (or adjacent to) the display area DA.

The pixels PXL may each be provided in the display area DA of the substrate SUB. In an embodiment, the pixels PXL may be arranged in the display area DA in a stripe arrangement structure or a pentile arrangement structure, but the embodiments are not limited thereto.

Each pixel PXL may include at least one light-emitting element LD driven by a corresponding scan signal and data signal. The light-emitting element LD may have a small size ranging from a nanoscale to a microscale and may be connected in parallel with adjacent light-emitting elements, but the embodiments are not limited thereto. The light-emitting element LD may constitute the light source of each pixel PXL.

Each pixel PXL may include at least one light source, for example, the light-emitting element LD illustrated in FIG. 1 driven by certain or predetermined signals (for example, a scan signal and a data signal) and/or certain or predetermined power sources (for example, first driving power and second driving power). However, the embodiments are not limited by the type of the light-emitting element LD used as the light source of each pixel PXL.

The driver may provide a certain or predetermined signal and certain or predetermined power to each pixel PXL through the line portion, thereby controlling the driving of the pixel PXL. The driver may include a scan driver, an emission driver, a data driver, and a timing controller.

Figure 22:
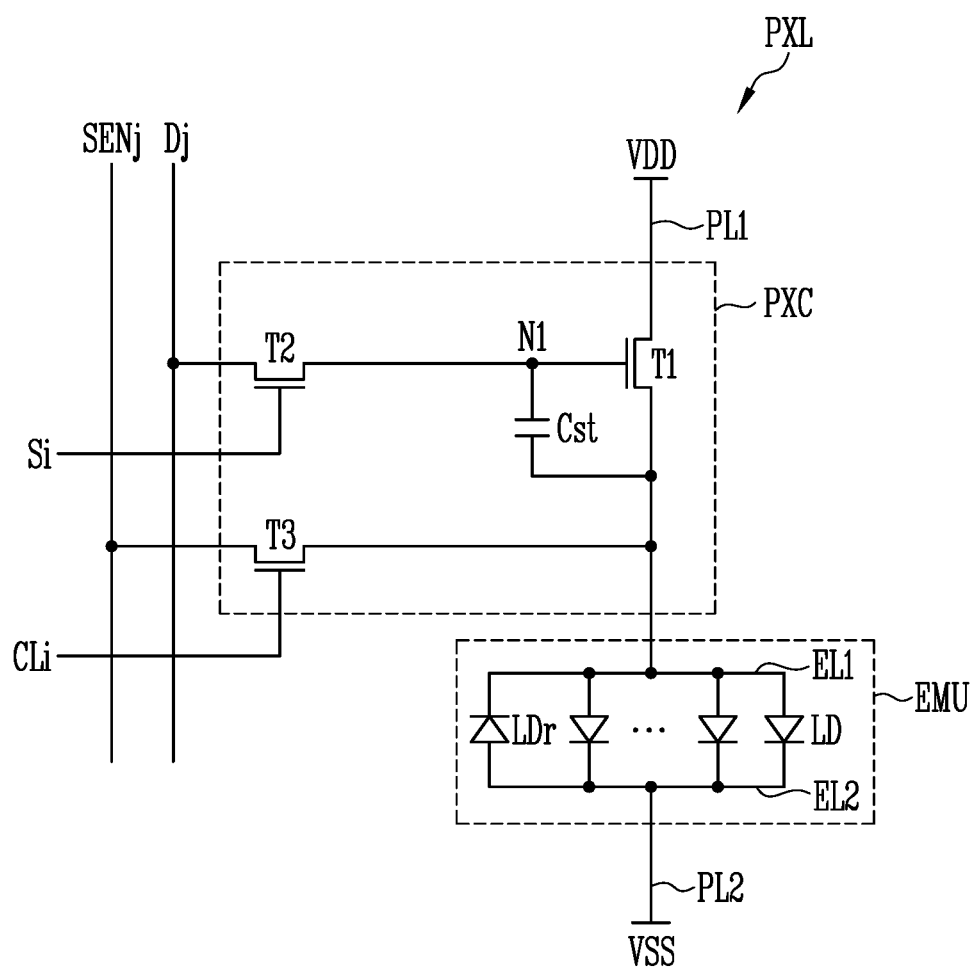
FIG. 22 is a circuit diagram illustrating an electrical connection relationship between components included in one pixel illustrated in FIG. 21 according to an embodiment.

FIG. 22 is a circuit diagram illustrating the electrical connections between components included in the pixel PXL illustrated in FIG. 21 according to an embodiment.

FIG. 22 illustrates the electrical connections between components included in a pixel PXL applicable to an active type display device according to an embodiment. However, the types of the components included in the pixel PXL to which the embodiments are applicable are not limited thereto.

In FIG. 22, not only the components included in each of the pixels illustrated in FIG. 21 but also the area in which the components are located may be collectively referred to as the pixel PXL.

Referring to FIGS. 1, 2, 21, and 22, a pixel PXL may include a light-emitting unit EMU which generates light having luminance corresponding to a data signal. The pixel PXL may further include a pixel circuit PXC for driving the light-emitting unit EMU.

According to embodiments, the light-emitting unit EMU may include a plurality of light-emitting elements LD connected in parallel with each other between a first power line PL1 to which a voltage of a first driving power source VDD is applied and a second power line PL2 to which a voltage of a second driving power source VSS is applied. For example, the light-emitting unit EMU may include a first pixel electrode EL1 (or "first alignment electrode") connected to the first driving power source VDD through the pixel circuit PXC and the first power line PL1, a second pixel electrode EL2 (or "second alignment electrode") connected to the second driving power source VSS through the second power line PL2, and the plurality of light-emitting elements LD connected in parallel with each other in the same direction between the first pixel electrode EL1 and the second pixel electrode EL2. In an embodiment, the first pixel electrode EL1 may be an anode, and the second pixel electrode EL2 may be a cathode.

Each of the light-emitting elements LD included in the light-emitting unit EMU may include one end portion connected to the first driving power source VDD through the first pixel electrode EL1 and the other end portion connected to the second driving power source VSS through the second pixel electrode EL2. The first driving power source VDD and the second driving power source VSS may have different potentials. As an example, the first driving power source VDD may be set as a high potential power source, and the second driving power source VSS may be set as a low potential power source. The potential difference between the first driving power source VDD and the second driving power source VSS may be set to be greater than or equal to the threshold voltage of the light-emitting elements LD during an emission period of the pixel PXL.

As described above, each of the light-emitting elements LD connected in parallel with each other in the same direction (for example, the forward direction) between the first pixel electrode EL1 and the second pixel electrode EL2, to which voltages having different potentials are supplied, may each constitute an effective light source. The effective light sources may be clustered to constitute the light-emitting unit EMU of the pixel PXL.

The light-emitting elements LD of the light-emitting unit EMU may emit light having luminance corresponding to the driving current supplied through the corresponding pixel circuit PXC. For example, during each frame period, the pixel circuit PXC may supply a driving current corresponding to the gradation value of the corresponding frame data to the light-emitting unit EMU. The driving current supplied to the light-emitting unit EMU may be divided to flow in each of the light-emitting elements LD. Accordingly, while each light-emitting element LD emits light at a luminance corresponding to the current flowing therein, the light-emitting unit EMU may emit light at a luminance corresponding to the driving current.

An embodiment is illustrated in which both end portions of the light-emitting elements LD are connected in the same direction between the first driving power source VDD and the second driving power source VSS, but the embodiments are not limited thereto. According to embodiments, the light-emitting unit EMU may further include at least one ineffective light source, for example, a reverse light-emitting element LDr, in addition to the light-emitting-elements LD constituting the effective light sources. The reverse light-emitting element LDr may be connected parallel with the light-emitting elements LD constituting the effective light sources between the first pixel electrode EL1 and the second pixel electrode EL2 and may be connected between the first pixel electrode EL1 and the second pixel electrode EL2 in an opposite direction as the light-emitting elements LD. The reverse light-emitting element LDr maintains an inactive state even when a driving voltage (for example, a driving voltage in a forward direction) is applied between the first pixel electrode EL1 and the second pixel electrode EL2, and thus, a current does not substantially flow in the reverse light-emitting element LDr.

The pixel circuit PXC may be connected to a scan line Si and a data line Dj of the corresponding pixel PXL. As an example, when the pixel PXL is disposed in an $i^{th}$ row and a $j^{th}$ column of a display area DA (wherein i is a natural number and j is a natural number), the pixel circuit PXC of the pixel PXL may be connected to an $i^{th}$ scan line Si and a $j^{th}$ data line Dj of the display area DA. In addition, the pixel circuit PXC may be connected to an $i^{th}$ control line CLi and a $j^{th}$ sensing line SENj of the display area DA.

The above-described pixel circuit PXC may include first to third transistors T1 to T3 and a storage capacitor Cst.

A first terminal of the first transistor T1 (driving transistor) may be connected to the first driving power source VDD, and a second terminal thereof may be electrically connected to the first pixel electrode EL1 of each of the light-emitting elements LD. A gate electrode of the first transistor T1 may be connected to a first node N1. The first transistor T1 may control the amount of a driving current supplied to the light-emitting elements LD in response to a voltage of the first node N1.

A first terminal of the second transistor T2 (switching transistor) may be connected to the $j^{th}$ data line Dj, and a second terminal thereof may be connected to the first node N1. Here, the first terminal and the second terminal of the second transistor T2 may be different terminals, and for example, when the first terminal is a source electrode, the second terminal may be a drain electrode. A gate electrode of the second transistor T2 may be connected to the $i^{th}$ scan line Si.

The second transistor T2 is turned on when a scan signal having a voltage, at which the second transistor T2 may be turned on, is supplied from the $i^{th}$ scan line Si, thereby electrically connecting the $j^{th}$ data line Dj and the first node N1. A data signal of a corresponding frame is supplied to the $j^{th}$ data line Dj, and thus, the data signal is transmitted to the first node N1. The data signal transmitted to the first node N1 is charged in the storage capacitor Cst.

The third transistor T3 may be connected between the first transistor T1 and the $j^{th}$ sensing line SENj. For example, a first terminal of the third transistor T3 may be connected to the first terminal (for example, a source electrode) of the first transistor T1 connected to the first pixel electrode EL1, and a second terminal of the third transistor T3 may be connected to the $j^{th}$ sensing line SENj. A gate electrode of the third transistor T3 may be connected to the $i^{th}$ control line CLi. The third transistor T3 is turned on by a control signal having a gate-on voltage supplied to the $i^{th}$ control line CLi during a sensing period, thereby electrically connecting the $j^{th}$ sensing line SENj and the first transistor T1.

The sensing period may be a period for extracting characteristic information (for example, the threshold voltage or the like of the first transistor T1) of each of the pixels PXL disposed in the display area DA.

One electrode of the storage capacitor Cst may be connected to the first driving power source VDD, and the other electrode may be connected to the first node N1. The storage capacitor Cst may be charged with a voltage corresponding to a data signal supplied to the first node N1 and may maintain the charged voltage until a data signal of a next frame is supplied.

FIG. 22 illustrates an embodiment in which all of the first to third transistors T1 to T3 are n-type transistors, but the embodiments are not limited thereto. For example, at least one of the above-described first to third transistors T1 to T3 may be changed to a p-type transistor. In addition, FIG. 22 illustrates an embodiment in which the light-emitting unit EMU is connected between the pixel circuit PXC and the second driving power source VSS, but the light-emitting unit EMU may be connected between the first driving power source VDD and the pixel circuit PXC.

The structure of the pixel circuit PXC may be changed and implemented in many ways. As an example, the pixel circuit PXC may further additionally include other circuit elements such as at least one transistor element for initializing the first node N1 and/or a transistor element for controlling emission times of the light-emitting elements LD, and a boosting capacitor for boosting the voltage of the first node N1.

FIG. 22 illustrates an embodiment in which the light-emitting elements LD constituting the light-emitting unit EMU are all connected in parallel, but the embodiments are not limited thereto. The light-emitting unit EMU may include at least one series stage including multiple light-emitting elements LD connected in parallel with each other. The light-emitting unit EMU may also have a series-and-parallel mixed structure.

The structure of the pixel PXL applicable to the embodiments are not limited to the embodiment illustrated in FIG. 22, and the pixel PXL may have various structures. For example, each pixel PXL may be provided inside a passive light-emitting display device. The pixel circuit PXC may be omitted, and both end portions of the light-emitting elements LD included in the light-emitting unit EMU may be connected directly to the $i^{th}$ scan line Si, the $j^{th}$ data line Dj, the first power line PL1 to which the first driving power source VDD is connected, the second power line PL2 to which the second driving power source VSS is connected, and/or a control line.

Figure 23:
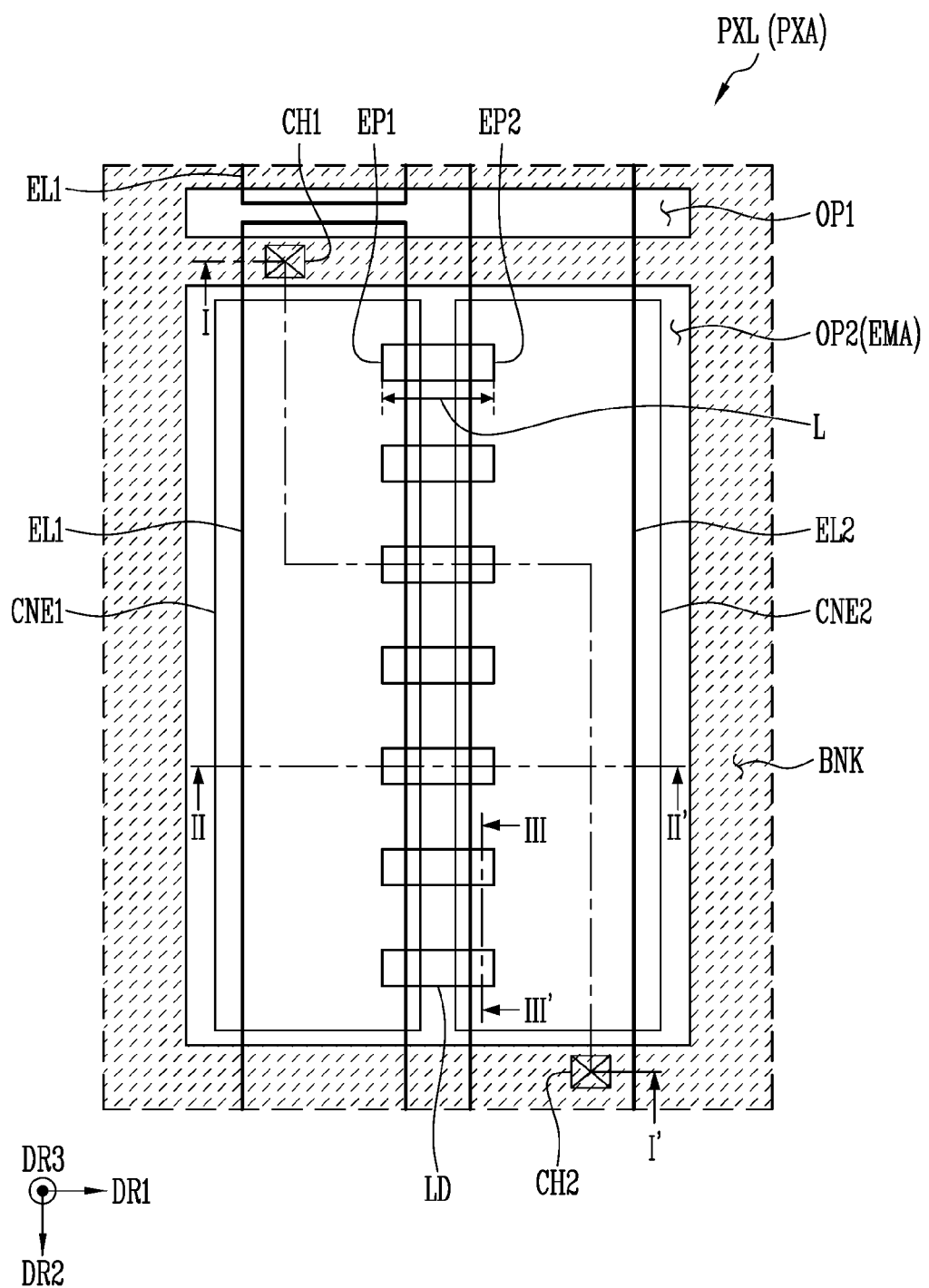
FIG. 23 is a schematic plan view illustrating one pixel of pixels illustrated in FIG. 21.

FIG. 23 is a schematic plan view illustrating one of the pixels illustrated in FIG. 21.

In FIG. 23, for convenience, the transistors and signal lines electrically connected to the transistors T are omitted.

In an embodiment, for convenience of description, a lateral direction (or horizontal direction) may be the first direction DR1, a longitudinal direction (or vertical direction) may be the second direction DR2, and a thickness direction of a substrate SUB in a cross section may be the third direction DR3. The first to third directions DR1, DR2, and DR3 may each refer to their respective directions.

Referring to FIG. 23, each pixel PXL may be formed in a pixel area PXA provided in the substrate SUB. The pixel area PXA may include an emission area EMA and a peripheral area. In an embodiment, the peripheral area may include a non-emission area from which light is not emitted.

According to embodiments, each pixel PXL may include a bank BNK disposed in the peripheral area.

The bank BNK may be a structure defining (or partitioning) the pixel area PXA or the emission area of each of the corresponding pixel PXL and adjacent pixels PXL and may be, for example, a pixel definition film. In an embodiment, in a process of supplying the light-emitting elements LD to each pixel PXL, the bank BNK may be a pixel definition film or a dam structure defining each emission area EMA to which the light-emitting elements LD should be supplied. As an example, the emission area EMA of each pixel PXL may be partitioned by the bank BNK, and thus, a mixed solution (for example, ink) including the desired amount and/or type of the light-emitting element LD may be supplied (or introduced) to the emission area EMA.

The bank BNK may include at least one light blocking material and/or reflective material to prevent light leakage defects in which light (or light rays) leaks between a pixel PXL and its adjacent pixels. According to embodiments, the bank BNK may include a transparent substance (or material). The transparent material may include, for example, a polyamide-based resin, a polyimide-based rein, or the like, but the embodiments are not limited thereto. According to another embodiment, a reflective material layer may be separately provided and/or formed on the bank BNK in order to further improve efficiency of light emitted from each pixel PXL.

The bank BNK may include one or more openings exposing components disposed under the bank BNK in the pixel area PXA of the corresponding pixel PXL. As an example, the bank BNK may include a first opening OP1 and a second opening OP2 exposing the components disposed under the bank BNK in the pixel area PXA of the corresponding pixel PXL. According to an embodiment, the emission area EMA of each pixel PXL and the second opening OP2 of the bank BNK may correspond to each other.

In the pixel area PXA, the first opening OP1 of the bank BNK may be disposed to be spaced apart from the second opening OP2 and may be disposed adjacent to one side (for example, an upper or lower side) of the pixel area PXA. As example, the first opening OP1 of the bank BNK may be disposed adjacent to the upper side of the pixel area PXA.

Each pixel PXL may include a first pixel electrode EL1 and a second pixel electrode EL2 spaced apart from each other in the first direction DR1. The first pixel electrode EL1 may correspond to the first pixel electrode EL1 in FIG. 22, and the second pixel electrode EL2 may correspond to the second pixel electrode EL2 in FIG. 22.

After the light-emitting elements LD are supplied and aligned in the pixel area PXA in a process of manufacturing a display device, the first pixel electrode EL1 of each pixel PXL may be separated (or cut) from another electrode that originally extends across multiple pixels PXL adjacent in the second direction DR2. The first opening OP1 of the bank BNK may be provided for the process of separating (or cutting) the original electrode into the first pixel electrode EL1 of each pixel PXL.

The first pixel electrode EL1 may be electrically connected to the first transistor T1 described with reference to FIG. 22 through a first contact hole CH1, and the second pixel electrode EL2 may be electrically connected to the second driving power source VSS (or second power line PL2) described with reference to FIG. 22 through a second contact hole CH2.

The first pixel electrode EL1 and the second pixel electrode EL2 may have a multi-layered structure including a reflective electrode and a conductive capping layer. In addition, the reflective electrode may have a single-layered or multi-layered structure. As an example, the reflective electrode may include at least one opaque metal layer and may optionally further include at least one transparent conductive layer disposed on and/or below the opaque metal layer.

Each pixel PXL may include multiple light-emitting elements LD. According to embodiments, each pixel PXL may further include the reverse light-emitting element LDr in FIG. 22.

The light-emitting elements LD may be disposed between the first pixel electrode EL1 and the second pixel electrode EL2. Each of the light-emitting elements LD may include a first end portion EP1 and a second end portion EP2 disposed at the end portions in a direction of its length L. In an embodiment, a second electrode 15 in ohmic contact with a p-type semiconductor layer may be disposed at the first end portion EP1, and a first electrode 16 in ohmic contact with an n-type semiconductor layer may be disposed at the second end portion EP2. Here, the p-type semiconductor layer may be the second semiconductor layer 13 described with reference to FIG. 1, and the n-type semiconductor layer may be the first semiconductor layer 11 described with reference to FIG. 1. The light-emitting elements LD may be connected in parallel with each other between the first pixel electrode EL1 and the second pixel electrode EL2. Each of the light-emitting elements LD may include the same components as the light-emitting element LD described in FIGS. 1 and 2.

In an embodiment, the first end portion EP1 of each of the light-emitting elements LD may be not provided directly on the first pixel electrode EL1 but may be electrically connected to the first pixel electrode EL1 through at least one contact electrode, for example, a first contact electrode CNE1. The second end portion EP2 of each of the light-emitting elements LD may also not be provided directly on the second pixel electrode EL2 but may be electrically connected to the second pixel electrode EL2 through at least another contact electrode, for example, a second contact electrode CNE2.

Each of the light-emitting elements LD may be a light-emitting diode having a micro size, for example, a small size ranging from a nanoscale to a microscale using a material having an inorganic crystal structure.

At least two to tens of the light-emitting elements LD may be aligned and/or provided in the emission area EMA of each pixel PXL, but the number of the light-emitting elements LD is not limited thereto. According to embodiments, the number of the light-emitting elements LD arranged and/or provided in the emission area EMA may be varied.

Each of the light-emitting elements LD may emit a color light and/or a white light. Each of the light-emitting elements LD may be aligned between the first pixel electrode EL1 and the second pixel electrode EL2 such that the direction of the length L is parallel to the first direction DR1. The light-emitting elements LD may be introduced (or supplied) to the emission area EMA of each pixel PXL by being sprayed in a solution.

The light-emitting elements LD may be introduced (or supplied) to the emission area EMA of each pixel PXL through an inkjet printing method, a slit coating method, or various other methods. As an example, the light-emitting elements LD may be mixed into a volatile solvent and introduced (or supplied) to the emission area EMA through the inkjet printing method or the slit coating method. When a corresponding alignment signal is applied to the first pixel electrode EL1 and the second pixel electrode EL2, an electric field may be formed between the first pixel electrode EL1 and the second pixel electrode EL2. As a result, the light-emitting elements LD may be aligned between the first pixel electrode EL1 and the second pixel electrode EL2. By volatilizing the solvent or removing the solvent through other methods after the light-emitting elements LD are aligned, the light-emitting elements LD may be stably aligned between the first pixel electrode EL1 and the second pixel electrode EL2.

According to embodiments, each pixel PXL may include the first contact electrode CNE1 and the second contact electrode CNE2.

The first contact electrode CNE1 may be provided and/or formed at the first end portion EP1 of each of the light-emitting elements LD and in a corresponding region of the first pixel electrode EL1, physically and/or electrically connecting the first end portion EP1 of each of the light-emitting elements LD to the first pixel electrode EL1. The first contact electrode CNE1 may be provided and/or formed on the first pixel electrode EL1 to overlap the first pixel electrode EL1. The first contact electrode CNE1 may have a bar-like shape extending in the second direction DR2 in a plan view, but the embodiments are not limited thereto. According to embodiments, the shape of the first contact electrode CNE1 may be varied as long as the first contact electrode CNE1 is electrically and stably connected to each of the light-emitting elements LD. In addition, the shape of the first contact electrode CNE1 may be varied in consideration of the connection with the first pixel electrode EL1 disposed under the first contact electrode CNE1.

The second contact electrode CNE2 may be provided and/or formed on the second end portion EP2 of each of the light-emitting elements LD and on a corresponding region of the second pixel electrode EL2, physically and/or electrically connecting the second end portion EP2 of each of the light-emitting elements LD to the second pixel electrode EL2. The second contact electrode CNE2 may be provided and/or formed on the second pixel electrode EL2 to overlap the second pixel electrode EL2. The second contact electrode CNE2 may have a bar-like shape extending in the second direction DR2 in a plan view, but the embodiments are not limited thereto. According to embodiments, the shape of the second contact electrode CNE2 may be varied as long as the second contact electrode CNE2 is electrically and stably connected to each of the light-emitting elements LD. In addition, the shape of the second contact electrode CNE2 may be varied in consideration of the connection with the second pixel electrode EL2 disposed under the second contact electrode CNE2.

Hereinafter, the stacked structure of each pixel PXL according to the above-described embodiment will be described with reference to FIGS. 24 to 29.

Figure 24:
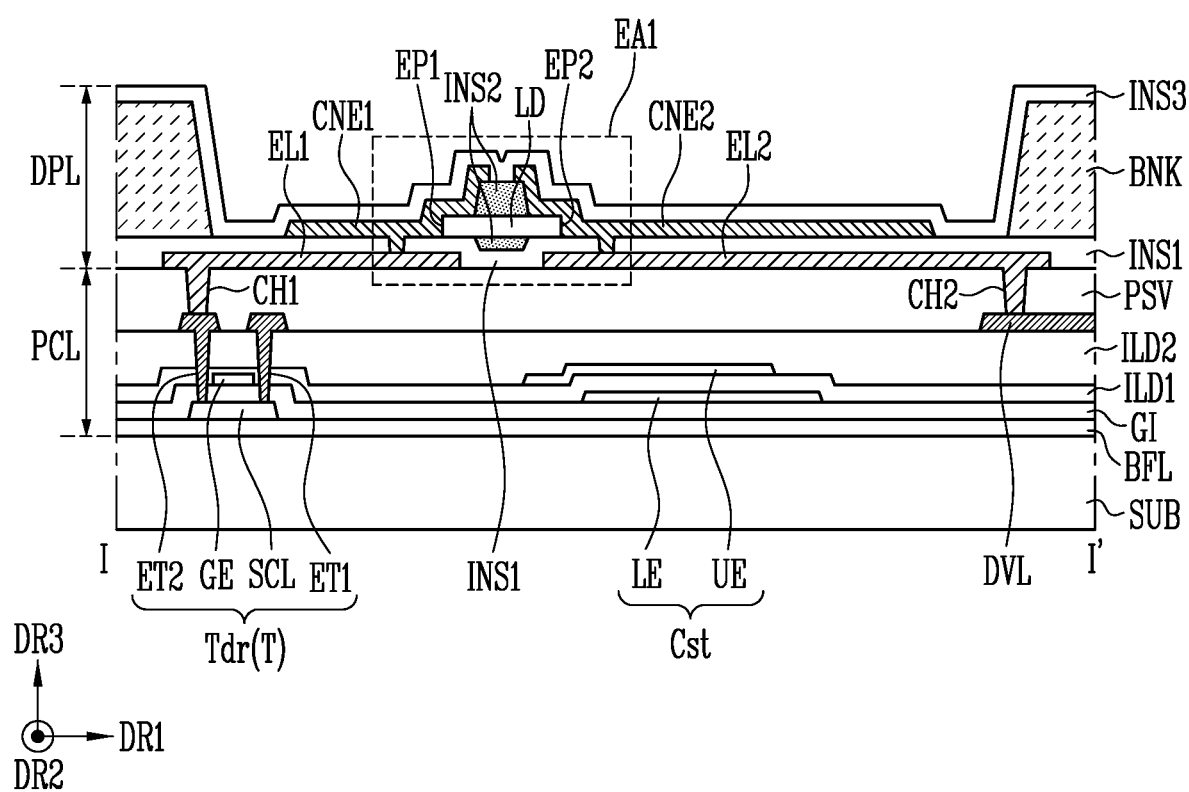
FIG. 24 is a cross-sectional view taken along line I-I' of FIG. 23.
Figure 25:
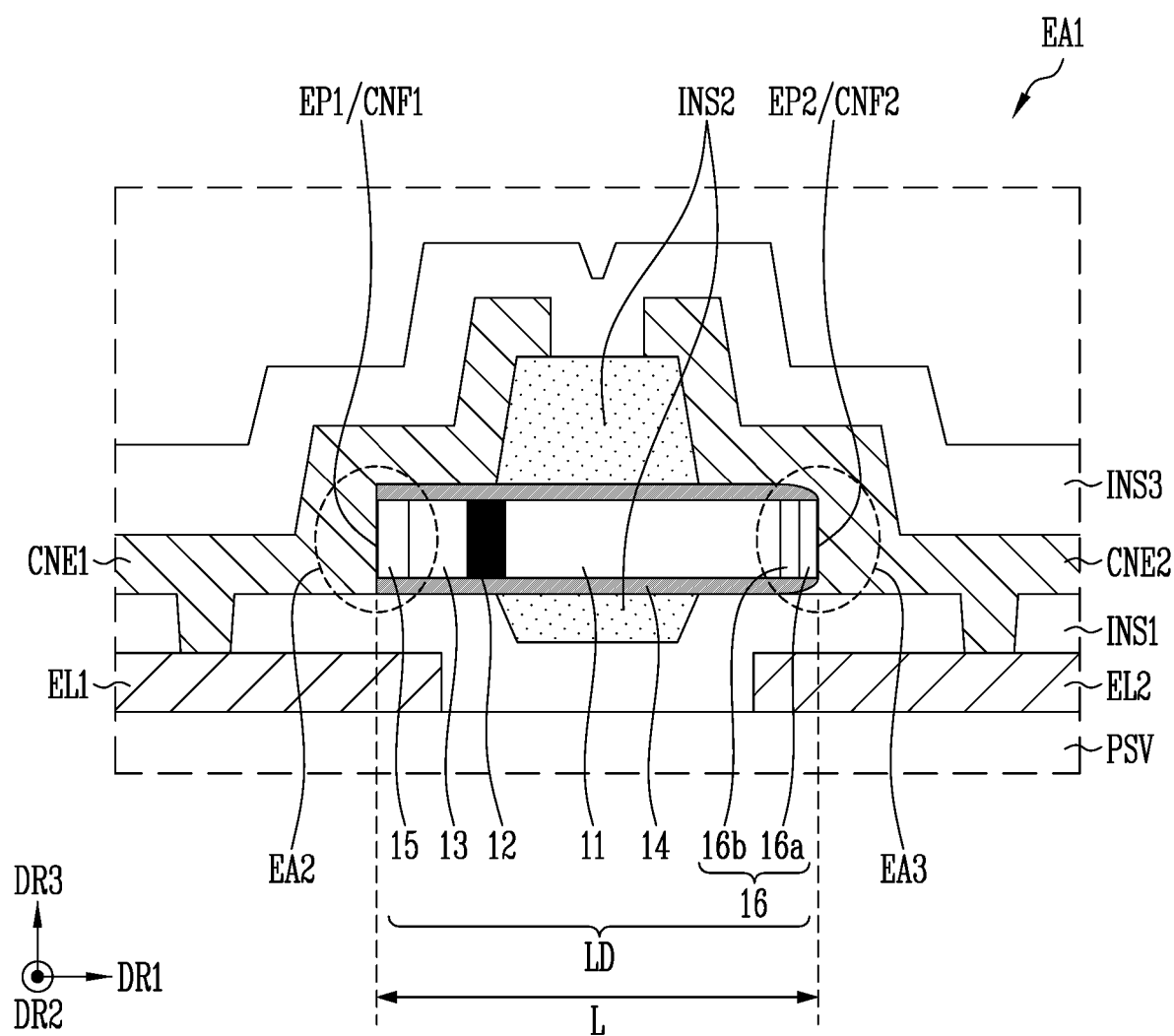
FIG. 25 is a schematic enlarged cross-sectional view of portion EA1 of FIG. 24.
Figure 26:
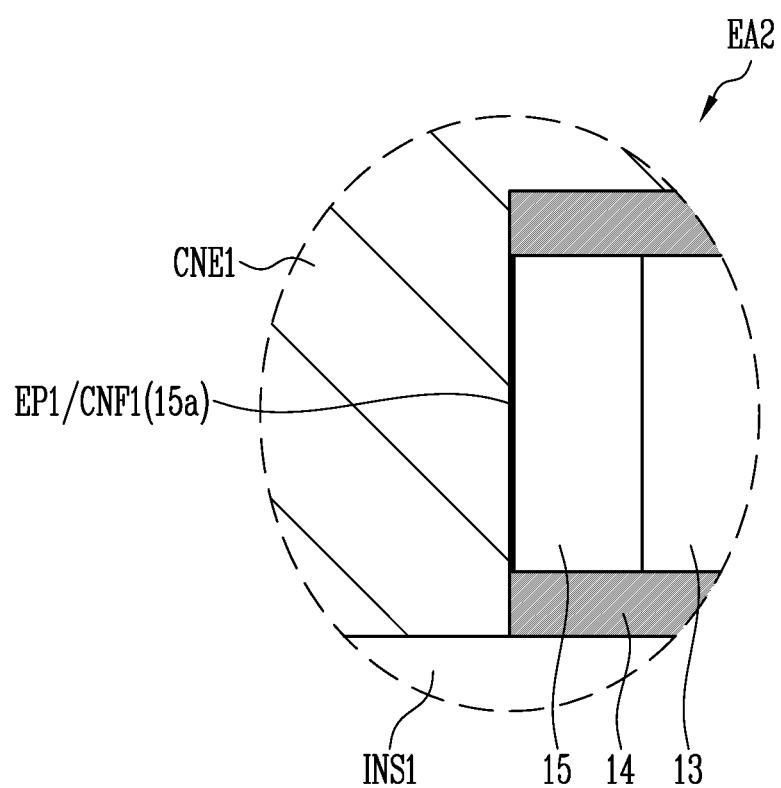
FIG. 26 is a schematic enlarged cross-sectional view of portion EA2 of FIG. 25.
Figure 27:
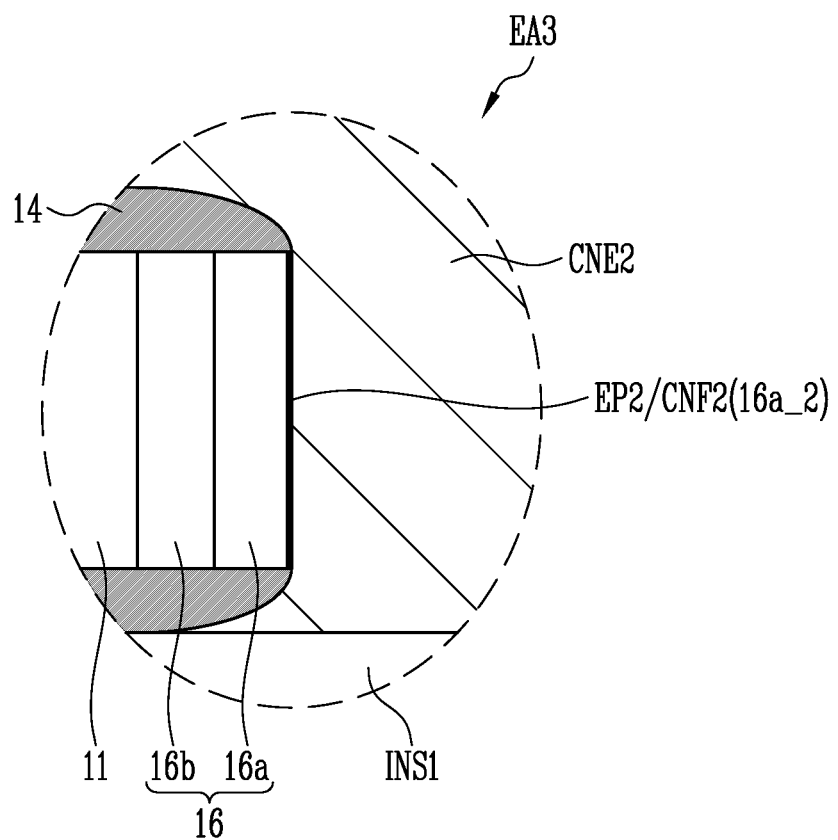
FIG. 27 is a schematic enlarged cross-sectional view of portion EA3 of FIG. 25.
Figure 28:
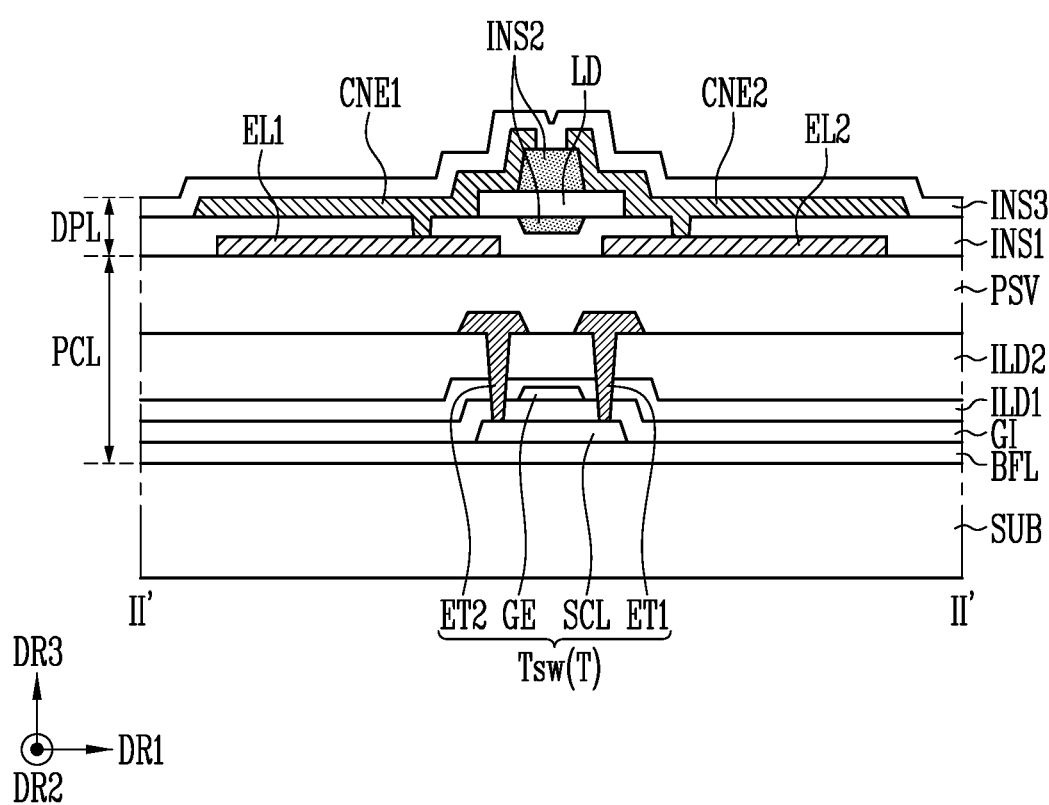
FIG. 28 is a cross-sectional view taken along line II-II' of FIG. 23.
Figure 29:
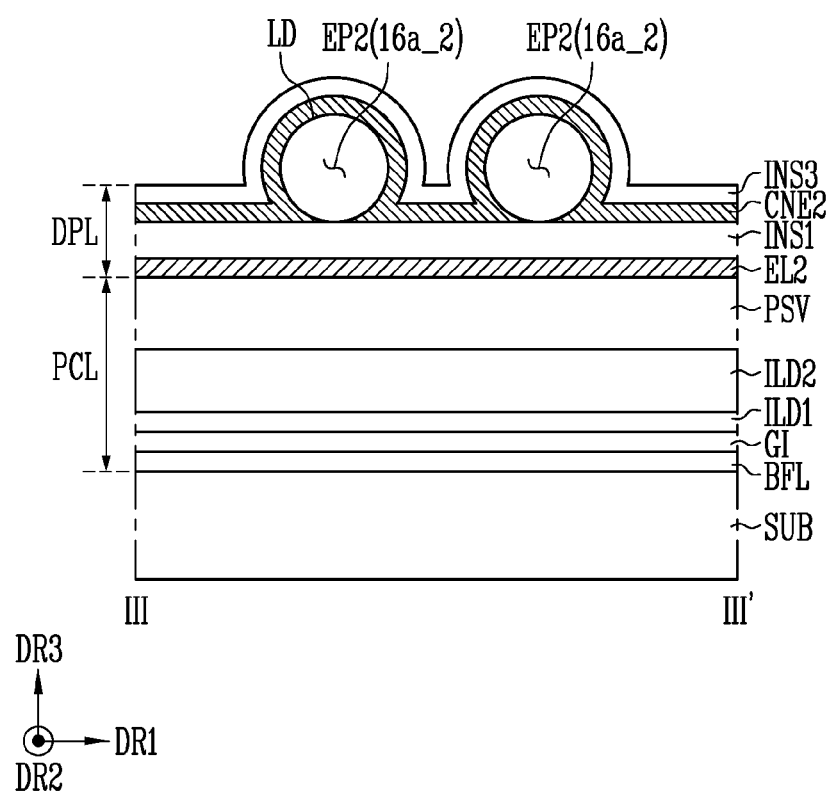
FIG. 29 is a cross-sectional view taken along line III-III' of FIG. 23

FIG. 24 is a cross-sectional view taken along line I-I' of FIG. 23. FIG. 25 is a schematic enlarged cross-sectional view of portion EA1 of FIG. 24. FIG. 26 is a schematic enlarged cross-sectional view of portion EA2 of FIG. 25. FIG. 27 is a schematic enlarged cross-sectional view of portion EA3 of FIG. 25. FIG. 28 is a cross-sectional view taken along line II-II' of FIG. 23. FIG. 29 is a cross-sectional view taken along line III-III' of FIG. 23.

In FIGS. 24 to 29, a pixel PXL is simplified and illustrated in such a manner that each electrode is illustrated as a single-film electrode and each insulating layer is illustrated only as a single-film insulating layer, but the embodiments are not limited thereto.

Referring to FIGS. 23 to 29, the pixel PXL may include a substrate SUB, a pixel circuit layer PCL, and a display element layer DPL.

The substrate SUB may include a transparent insulating material to transmit light. The substrate SUB may be a rigid substrate or a flexible substrate.

The rigid substrate may be, for example, one of an organic substrate, a quartz substrate, a glass ceramic substrate, or a crystalline glass substrate.

The flexible substrate may be one of a film substrate and a plastic substrate which may include a polymer organic material. For example, the flexible substrate may include at least one material selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

The pixel circuit layer PCL may include a buffer layer BFL, at least one transistor T, at least one storage capacitor Cst, and a passivation layer PSV.

The buffer layer BFL may prevent impurities from being diffused into the transistor T included in the pixel circuit (refer to "PXC" in FIG. 22). The buffer layer BFL may be an inorganic insulating film including an inorganic material. The buffer layer BFL may include at least one material selected from metal oxides such as silicon nitride ($SiN_x$), silicon oxide ($SiO_x$), silicon oxynitride ($SiO_xN_y$), and aluminum oxide ($AlO_x$). The buffer layer BFL may be provided as a single-film but may also be provided as a multi-film including at least two films. When the buffer layer BFL is provided as the multi-film, respective layers may be made of the same material or may be made of different materials. The buffer layer BFL may be omitted according to the material and process conditions of the substrate SUB.

The transistor T may include a driving transistor Tdr for controlling a driving current of the light-emitting elements LD and a switching transistor Tsw electrically connected to the driving transistor Tdr. However, the embodiments are not limited thereto, and the pixel circuit PXC may further include circuit elements that perform other functions in addition to the driving transistor Tdr and the switching transistor Tsw. The driving transistor Tdr may be the first transistor T1 in FIG. 22, and the switching transistor Tsw may be the second transistor T2 in FIG. 22. In the following embodiments, the driving transistor Tdr and the switching transistor Tsw will be collectively referred to as a transistor T or transistors T.

The driving transistor Tdr and the switching transistor Tsw may each include a semiconductor pattern SCL, a gate electrode GE, a first terminal ET1, and a second terminal ET2. The first terminal ET1 may be either a source electrode or a drain electrode, and the second terminal ET2 may be the other electrode.

The semiconductor pattern SCL may be provided and/or formed on the buffer layer BFL. The semiconductor pattern SCL may include a first contact region in contact with the first terminal ET1 and a second contact region in contact with the second terminal ET2. A region between the first contact region and the second contact region may be a channel region. The channel region may overlap the gate electrode GE of the corresponding transistor T. The semiconductor pattern SCL may be a semiconductor pattern made of poly silicon, amorphous silicon, an oxide semiconductor, or the like. The channel region may be, for example, a semiconductor pattern that is not doped with impurities and may be an intrinsic semiconductor. The first contact region and the second contact region may be semiconductor patterns doped with impurities.

The gate electrode GE may be provided and/or formed on a gate insulating layer GI and correspond to the channel region of the semiconductor pattern SCL. The gate electrode GE may be provided on the gate insulating layer GI to overlap the channel region of the semiconductor pattern SCL. The gate electrode GE may have a single-film structure made of a material selected from the group consisting of copper (Cu), molybdenum (Mo), tungsten (W), aluminum neodymium (AlNd), titanium (Ti), aluminum (Al), silver (Ag), and an alloy of these materials, or a mixture of these materials. The gate electrode may also have a double-film or multi-film structure including a low resistance material, such as molybdenum (Mo), titanium (Ti), copper (Cu), aluminum (Al), or silver (Ag) in order to reduce line resistance.

The gate insulating layer GI may be an inorganic insulating film including an inorganic material. As an example, the gate insulating layer GI may include at least one material selected from metal oxides such as silicon nitride ($SiN_x$), silicon oxide ($SiO_x$), silicon oxynitride ($SiO_xN_y$), and aluminum oxide ($AlO_x$). However, the material of the gate insulating layer GI is not limited thereto. According to embodiments, the gate insulating layer GI may be formed as an organic insulating film including an organic material. The gate insulating layer GI may be provided as a single-film, but may also be provided as a multi-film including at least two films.

The first terminal ET1 and the second terminal ET2 may each be provided and/or formed on a second interlayer insulating layer ILD2 and may be in contact with the first contact region and the second contact region of the semiconductor pattern SCL through contact holes passing through the gate insulating layer GI and first and second interlayer insulating layers ILD1 and ILD2. As an example, the first terminal ET1 may be in contact with the first contact region of the semiconductor pattern SCL, and the second terminal ET2 may be in contact with the second contact region of the semiconductor pattern SCL. Each of the first and second terminals ET1 and ET2 may include the same materials as the gate electrode GE or may include at least one material selected from the materials described as structure materials of the gate electrode GE.

The first interlayer insulating layer ILD1 may include the same material as the gate insulating layer GI or may include at least one material selected from the materials described as structural materials of the gate insulating layer GI.

The second interlayer insulating layer ILD2 may be provided and/or formed on the first interlayer insulating layer ILD1. The second interlayer insulating layer ILD2 may be an inorganic insulating film including an inorganic material or an organic insulating film including an organic material. According to embodiments, the second interlayer insulating layer ILD2 may include the same material as the first interlayer insulating layer ILD1, but the embodiments are not limited thereto. The second interlayer insulating layer ILD2 may be provided as a single-film but may also be provided as a multi-film including at least two films.

In the embodiments, the first and second terminals ET1 and ET2 of the transistor T may be separate electrodes electrically connected to the semiconductor pattern SCL through the contact holes passing through the gate insulating layer GI and the first and second interlayer insulating layers ILD1 and ILD2, but the embodiments are not limited thereto. The first terminal ET1 may be a first contact region adjacent to the channel region of the corresponding semiconductor pattern SCL, and the second terminal ET2 may be a second contact region adjacent to the channel region of the corresponding semiconductor pattern SCL. The second terminal ET2 of the transistor T may be electrically connected to the light-emitting elements LD of the corresponding pixel PXL through a separate connection means such as a bridge electrode or the like.

In an embodiment, the transistors T may be formed as low temperature polysilicon thin film transistors, but the embodiments are not limited thereto. The transistors T may be formed as oxide semiconductor thin film transistors. Furthermore, the transistors T are described as thin film transistors having a top gate structure, but the embodiments are not limited thereto. The structure of the transistors T may be varied.

The storage capacitor Cst may include a lower electrode LE provided on the gate insulating layer GI and an upper electrode UE provided on the first interlayer insulating layer ILD1 to overlap the lower electrode LE.

The lower electrode LE may be provided on the same layer as the gate electrode GE of the driving transistor Tdr and may include the same material as the gate electrode GE. The lower electrode LE may be integrally provided with the gate electrode GE of the driving transistor Tdr. The lower electrode LE may be regarded as a region of the gate electrode GE of the driving transistor Tdr. According to embodiments, the lower electrode LE may be provided as a component that is separate from (or non-integral with) the gate electrode GE of the driving transistor Tdr. The lower electrode LE and the gate electrode GE of the driving transistor Tdr may be electrically connected through a separate connection means.

The upper electrode UE may overlap the lower electrode LE and may cover the lower electrode LE. A capacitance of the storage capacitor Cst may be increased by increasing the overlapping area of the upper electrode UE and the lower electrode LE. The upper electrode UE may be electrically connected to the first power line (refer to "PL1" of FIG. 22). The storage capacitor Cst may be covered by the second interlayer insulating layer ILD2.

The pixel circuit layer PCL may include a driving voltage line DVL provided and/or formed on the second interlayer insulating layer ILD2. The driving voltage line DVL may be the same component as the second power line PL2 described in FIG. 22. Accordingly, a voltage of a second driving power source VSS may be applied to the driving voltage line DVL. The pixel circuit layer PCL may further include the first power line PL1 connected to a first driving power source VDD. Although not illustrated directly in the drawings, the first power line PL1 may be provided on the same layer as the driving voltage line DVL or on a different layer from the driving voltage line DVL. In the embodiments, the driving voltage line DVL may be provided on the same layer as the first and second terminals ET1 and ET2 of the transistors T, but the embodiments are not limited thereto. According to embodiments, the driving voltage line DVL may be provided on the same layer as any of the conductive layers provided in the pixel circuit layer PCL. The position of the driving voltage line DVL in the pixel circuit layer PCL may be varied.

Each of the first power line PL1 and the driving voltage line DVL may include a conductive material (substance). As an example; each of the first power line PL1 and the driving voltage line DVL may have a single-film structure made of a material selected from the group consisting of copper (Cu), molybdenum (Mo), tungsten (W), aluminum neodymium (AlNd), titanium (Ti), aluminum (Al), silver (Ag), an alloy of these materials, or a mixture of these materials. The first power line PL1 and the driving voltage line DVL may also have a double-film or multi-film structure including a low resistance material, such as molybdenum (Mo), titanium (Ti), copper (Cu), aluminum (Al), or silver (Ag) in order to reduce line resistance. As an example, the first power line PL1 and the driving voltage line DVL may be formed as a double-film in which titanium (Ti) and copper (Cu) are stacked.

The first power supply line PL1 may be electrically connected to some components of the display element layer DPL, for example, the first pixel electrode EL1, and the driving voltage line DVL may be electrically connected to other components of the display element layer DPL, for example, the second pixel electrode EL2.

The passivation layer PSV may be provided and/or formed on the transistors T and the driving voltage line DVL.

The passivation layer PSV may be provided in the form of an organic insulating film, an inorganic insulating film, or an organic insulating film disposed on an inorganic insulating film. The inorganic insulating film may include, for example, at least one selected from metal oxides such as silicon oxide ($SiO_x$), silicon nitride ($SiN_x$), silicon oxynitride ($SiO_xN_y$), and aluminum oxide ($AlO_x$). The organic insulating film may include, for example, at least one selected from an acrylic-based resin (polyacrylate-based resin), an epoxy-based resin, a phenolic-based resin, a polyamide-based resin, a polyimide-based resin, an unsaturated polyester-based resin, a polyphenylene ether-based resin, a polyphenylene sulfide-based resin, and a benzocyclobutene resin.

The passivation layer PSV may include the first contact hole CH1 exposing the second terminal ET2 of the driving transistor Tdr and the second contact hole CH2 exposing the driving voltage line DVL.

The display element layer DPL may be provided on the passivation layer PSV.

The display element layer DPL may include the bank BNK, the first and second pixel electrodes EL1 and EL2, the light-emitting elements LD, the first and second contact electrodes CNE1 and CNE2, and first to third insulating layers INS1 to INS3.

The bank BNK may be provided and/or formed on the first insulating layer INS1 and may define (or partition) the emission area EMA of the corresponding pixel PXL. The bank BNK may include the first opening OP1 and the second opening OP2 spaced apart from the first opening OP1. The second opening OP2 of the bank BNK may correspond to the emission area EMA of each of the pixels PXL.

The first pixel electrode EL1 and the second pixel electrode EL2 may be disposed to be spaced apart from each other in the first direction DR1. An end portion of the first pixel electrode EL1 may be disposed in the first opening OP1 of the bank BNK. After the light-emitting elements LD are supplied and aligned in the pixel area PXA of the corresponding pixel PXL in a process of manufacturing a display device, the first pixel electrode EL1 may be separated from another electrode (for example, the first electrode (not illustrated) provided to each of the adjacent pixels PXL adjacent in the second direction DR2 in a plan view) in the first opening OP1. The first opening OP1 of the bank BNK may be provided for a process of separating the first pixel electrode EU.

In the embodiments, it was described that only the first pixel electrode EL1 is separated (or cut) from another electrode in the first opening OP1 of the bank BNK, but the embodiments are not limited thereto. According to embodiments, the second pixel electrode EL2 may be separated from another electrode that originally extends across multiple pixels PXL adjacent in the second direction DR2. The first opening OP1 of the bank BNK may be provided for the process of separating (or cutting) both the first pixel electrode EL1 and the second pixel electrode EL2.

Each of the first pixel electrode EL1 and the second pixel electrode EL2 may be made of a material having certain or predetermined reflectance to allow light emitted from each of the light-emitting elements LD to travel in an image display direction (for example, a front direction) of a display device. As an example, each of the first and second pixel electrodes EL1 and EL2 may be made of a conductive substance (or material) having certain or predetermined reflectance. The conductive substance (or material) may include an opaque metal that is advantageous in reflecting light emitted from the light-emitting elements LD in an image display direction of a display device. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), or an alloy thereof. According to embodiments, each of the first and second pixel electrodes EL1 and EL2 may include a transparent conductive substance (or material). The transparent conductive substance (or material) may include a conductive material such as indium tin oxide (ITO), indium zinc oxide (IZO), zinc oxide (ZnO), indium gallium zinc oxide (IGZO), or indium tin zinc oxide (ITZO), or a conductive polymer such as poly (3,4-ethylenedioxythiophene) (PEDOT). When the first and second pixel electrodes EL1 and EL2 include the transparent conductive substance (or material), a separate conductive layer made of an opaque metal may be added to reflect light emitted from the light-emitting elements LD in an image display direction of a display device. However, the material of the first and second pixel electrodes EL1 and EL2 is not limited to the above-described materials.

Furthermore, each of the first and second pixel electrodes EL1 and EL2 may be provided and/or formed as a single-film, but the embodiments are not limited thereto. According to embodiments, each of the first and second pixel electrodes EL1 and EL2 may be provided and/or formed as a multi-film in which at least two materials selected from metals, alloys, conductive oxides, and conductive polymers are stacked. In order to minimize distortion due to signal delay when a signal (or voltage) is transmitted to both end portions EP1 and EP2 of each of the light-emitting elements LD, each of the first and second pixel electrodes EL1 and EL2 may be formed as a multi-film including at least two films. As an example, each of the first and second pixel electrodes EL1 and EL2 may be formed as a multi-film in which indium tin oxide (ITO), silver (Ag), and ITO are stacked.

The first pixel electrode EL1 may be electrically connected to the driving transistor Tdr of the pixel circuit layer PCL through the first contact hole CH1 of the passivation layer PSV, and the second pixel electrode EL2 may be electrically connected to the driving voltage line DVL of the pixel circuit layer PCL through the second contact hole CH2 of the passivation layer PSV. The first and second pixel electrodes EL1 and EL2 may be used as alignment electrodes for aligning the light-emitting elements LD in each pixel PXL. Furthermore, the first and second pixel electrodes EL1 and EL2 may be used as driving electrodes for driving the light-emitting elements LD after the light-emitting elements LD are aligned.

The first insulating layer INS1 may be provided and/or formed on the first pixel electrode EU and the second pixel electrode EL2.

The first insulating layer INS1 may include an inorganic insulating film made of an inorganic material or an organic insulating film made of an organic material. The first insulating layer INS1 may be formed as the inorganic insulating film that is advantageous in protecting the light-emitting elements LD from the pixel circuit layer PCL. As an example, the first insulating layer INS1 may include at least one material selected from metal oxides such as silicon nitride ($SiN_x$), silicon oxide ($SiO_x$), silicon oxynitride ($Si-O_xN_y$), and aluminum oxide ($AlO_x$), but the embodiments are not limited thereto. According to embodiments, the first insulating layer INS1 may be formed as the organic insulating film that is advantageous in planarizing support surfaces of the light-emitting elements LD.

The first insulating layer INS1 may be provided and/or formed on the passivation layer PSV to entirely cover the first pixel electrode EL1 and the second pixel electrode EL2. After the light-emitting elements LD are supplied and aligned on the first insulating layer INS1, as illustrated in FIGS. 24, 25, and 28, the first insulating layer INS1 may be partially opened to expose one region of each of the first and second pixel electrodes EL1 and EL2. After the light-emitting elements LD are supplied and aligned, the first insulating layer INS1 may be patterned in the form of an individual pattern that is locally disposed only below the light-emitting elements LD. The first insulating layer INS1 may cover the remaining regions excluding one region of each of the first and second pixel electrodes EL1 and EL2. The first insulating layer INS1 may be omitted according to embodiments.

The bank BNK may be provided and/or formed on the first insulating layer INS1. The bank BNK is formed between other pixels PXL so as to surround the emission area EMA of each pixel PXL and may constitute a pixel definition layer that partitions the emission area EMA of the pixel PXL. In a process of supplying the light-emitting elements LD to the emission area EMA, the bank BNK may be a dam structure that performs control to prevent a solution, in which the light-emitting elements LD are mixed, from flowing into the emission area EMA of the adjacent pixel PXL or to supply a certain or predetermined amount of the solution to each emission area EMA.

The light-emitting elements LD may be supplied and aligned in the emission area EMA of each pixel PXL in which the first insulating layer INS1 is formed. As an example, the light-emitting elements LD may be supplied (or introduced) to the emission area EMA through an inkjet method or the like. The light-emitting elements LD may be aligned between the first pixel electrode EL1 and the second pixel electrode EL2 by a certain or predetermined alignment signal (or alignment voltage) applied to each of the first and second pixel electrodes EL1 and EL2.

Each of the light-emitting elements LD may include the first end portion EP1 and the second end portion EP2 in the direction of the length L parallel to the first direction DR1. Each of the light-emitting elements LD may include a light-emitting stack pattern 10 and an insulating film 14 surrounding an outer circumferential surface (or surface) thereof. The light-emitting stack pattern 10 may include the second electrode 15, the second semiconductor layer 13, an active layer 12, the first semiconductor layer 11, and the first electrode 16 which are stacked in the direction of the length L of each light-emitting element LD parallel to the first direction DR1. In an embodiment, the first semiconductor layer 11 may include an n-type semiconductor layer doped with an n-type dopant, and the second semiconductor layer 13 may include a p-type semiconductor layer doped with a p-type dopant.

The second electrode 15 in ohmic contact with the second semiconductor layer 13 may be disposed at the first end portion EP1 of each light-emitting element LD, and the first electrode 16 in ohmic contact with the first semiconductor layer 11 may be disposed at the second end portion EP2 of each light-emitting element LD.

The second insulating layer INS2 may be provided and/or formed on the light-emitting elements LD. The second insulating layer INS2 may be provided and/or formed on the light-emitting elements LD aligned between the first pixel electrode EL1 and the second pixel electrode EL2, thereby partially covering an outer circumferential surface (or surface) of each of the light-emitting elements LD and exposing the first end portion EP1 and the second end portion EP2 of each of the light-emitting elements LD.

The second insulating layer INS2 may be formed as a single-film or a multi-film and may include an inorganic insulating film including at least one inorganic material or an organic insulating film including at least one organic material. The second insulating layer INS2 may include the inorganic insulating film that is advantageous in protecting the active layer 12 of each of the light-emitting elements LD from external oxygen, moisture, or the like. However, the embodiments are not limited thereto. The second insulating layer INS2 may be formed as an organic insulating film including an organic material according to design conditions of a display device to which the light-emitting elements LD are applied. After the alignment of the light-emitting elements LD is completed in the pixel area PXA of each of the pixels PXL, the second insulating layer INS2 may be formed on the light-emitting elements LD to prevent the light-emitting elements LD from deviating from positions at which the light-emitting elements LD are aligned.

When an empty gap (or space) is between the first insulating layer INS1 and the light-emitting elements LD before the second insulating layer INS2 is formed, the empty gap may be filled with the second insulating layer INS2 in a process of forming the second insulating layer INS2. The second insulating layer INS2 may be formed as an organic insulating film that is advantageous in filling the empty gap between the first insulating layer INS1 and the light-emitting elements LD.

The first contact electrode CNE1 may be provided and/or formed on the first pixel electrode EL1 to electrically and/or physically stably connect the first pixel electrode EL1 and one end portion of the first and second end portions EP1 and EP2 of the light-emitting elements LD, for example, the first end portion EP1.

The first contact electrode CNE1 may be provided and/or formed on the first pixel electrode EL1 and the first end portion EP1 of each of the light-emitting elements LD. The first contact electrode CNE1 may be disposed to be in contact with the first pixel electrode EL1 on a region of the first pixel electrode EL1 which is not covered by the first insulating layer INS1. According to embodiments, when a conductive capping layer (not illustrated) is disposed on the first pixel electrode EL1, the first contact electrode CNE1 may be disposed on the conductive capping layer to be connected to the first pixel electrode EL1 through the conductive capping layer. The conductive capping layer may protect the first pixel electrode EU from defects or the like generated in a process of manufacturing a display device and may also further intensify adhesion between the first pixel electrode EL1 and the pixel circuit layer PCL. The conductive capping layer may include a transparent conductive substance (or material) such as indium zinc oxide (IZO).

The first contact electrode CNE1 may be disposed at the first end portion EP1 of each of the light-emitting elements LD so as to be in contact with the first end portion EP1 of each of the light-emitting elements LD adjacent to the first pixel electrode EL1. The first contact electrode CNE1 may be disposed to cover the first end portion EP1 of each of the light-emitting elements LD and at least one region of the first pixel electrode EU corresponding thereto.

The second contact electrode CNE2 may be provided and/or formed on the second pixel electrode EL2 to electrically and/or physically stably connect the second pixel electrode EL2 and one end portion of the first and second end portions EP1 and EP2 of the light-emitting elements LD, for example, the second end portion EP2.

The second contact electrode CNE2 may be provided and/or formed on the second pixel electrode EL2 and the second end portion EP2 of each of the light-emitting elements LD. The second contact electrode CNE2 may be disposed to be in contact with the second pixel electrode EL2 on a region of the second pixel electrode EL2 which is not covered by the first insulating layer INS1. According to embodiments, when a conductive capping layer is disposed on the second pixel electrode EL2, the second contact electrode CNE2 may be disposed on the conductive capping layer to be connected to the second pixel electrode EL2 through the conductive capping layer.

The second contact electrode CNE2 may be disposed at the second end portion EP2 of each of the light-emitting elements LD so as to be in contact with the second end portion EP2 of each of the light-emitting elements LD adjacent to the second pixel electrode EL2. The second contact electrode CNE2 may be disposed to cover the second end portion EP2 of each of the light-emitting elements LD and at least one region of the second pixel electrode EL2 corresponding thereto.

The first and second contact electrodes CNE1 and CNE2 may be made of various transparent conductive materials to allow light, which is emitted from each of the light-emitting elements LD and is reflected by the first and second pixel electrodes EL1 and EL2, to travel in an image display direction of a display device without loss. As an example, the first and second contact electrodes CNE1 and CNE2 may include at least one material selected from various transparent conductive substances (materials) such as indium tin oxide (ITO), indium zinc oxide (IZO), zinc oxide (ZnO), indium gallium zinc oxide (IGZO), and indium tin zinc oxide (ITZO) and may be substantially transparent or semi-transparent to satisfy desired transmittance (or transmittancy). However, the material of the first and second contact electrodes CNE1 and CNE2 is not limited to the above-described embodiment. According to embodiments, the first and second contact electrodes CNE1 and CNE2 may be made of various opaque conductive substances (or materials). The first and second contact electrodes CNE1 and CNE2 may be formed as a single-film or a multi-film.

The first contact electrode CNE1 and the second contact electrode CNE2 may be disposed to be spaced apart from each other in the first direction DR1. As an example, the first contact electrode CNE1 and the second contact electrode CNE2 may be disposed to be spaced apart from each other by a certain or predetermined distance on the second insulating layer INS2 on the light-emitting elements LD.

The first contact electrode CNE1 and the second contact electrode CNE2 may be provided on the same layer. The first contact electrode CNE1 and the second contact electrode CNE2 may be formed using the same conductive material through the same process, but the embodiments are not limited thereto. According to embodiments, the first contact electrode CNE1 and the second contact electrode CNE2 may be formed through different processes and provided on different layers. This will be described below with reference to FIG. 33.

The third insulating layer INS3 may be provided and/or formed on the first and second contact electrodes CNE1 and CNE2. The third insulating layer INS3 may be an inorganic insulating film including an inorganic material or an organic insulating film including an organic material. As an example, the third insulating layer INS3 may have a structure in which at least one inorganic insulating film and at least one organic insulating film are alternately stacked. The third insulating layer INS3 may entirely cover the display element layer DPL to prevent external water or moisture from being introduced into the display element layer DPL including the light-emitting elements LD.

According to embodiments, the display element layer DPL may optionally further include an optical layer in addition to the third insulating layer INS3. As an example, the display element layer DPL may further include a color conversion layer including color conversion particles that convert light emitted from the light-emitting elements LD into specific color light.

According to another embodiment, at least one overcoat layer (for example, a layer that planarizes an upper surface of the display element layer DPL) may be further disposed on the third insulating layer INS3.

The light-emitting stack pattern 10 of each light-emitting element LD may include the second electrode 15, the second semiconductor layer 13, the active layer 12, the first semiconductor layer 11, and the first electrode 16 which are stacked in the direction of the length L of the corresponding light-emitting element LD. In an embodiment, the first electrode 16 may include a second layer 16b disposed on the first semiconductor layer 11 and a first layer 16a disposed on the second layer 16b. The first layer 16a and the second layer 16b may be made of a transparent conductive material having certain or predetermined transmittance.

The first layer 16a may be a component in direct contact with the second contact electrode CNE2 and may be a light-transmitting conductive layer. The second layer 16b may be a component in direct contact with the first semiconductor layer 11 and may be an ohmic contact layer. The first layer 16a and the second layer 16b may be made of the same ohmic material or different ohmic materials according to embodiments. In an embodiment, the first layer 16a and the second layer 16b may be made of different ohmic materials.

The second electrode 15 disposed at the first end portion EP1 of each light-emitting element LD may be in direct contact with the first contact electrode CNE1. A contact surface CNF1 (hereinafter, referred to as a "first contact surface") between the second electrode 15 and the first contact electrode CNE1 may be the first end portion EP1 of each light-emitting element LD. The first layer 16a of the first electrode 16 disposed at the second end portion EP2 of each light-emitting element LD may be in direct contact with the second contact electrode CNE2. A contact surface CNF2 (hereinafter, referred to as a "second contact surface") between the first layer 16a and the second contact electrode CNE2 may be the second end portion EP2 of each light-emitting element LD.

The first contact surface CNF1 and the second contact surface CNF2 may have substantially the same or similar area (or size). In an embodiment, the first contact surface CNF1 may be the same as a lower surface 15a of the second electrode 15, and the second contact surface CNF2 may be the same as an upper surface 16a_2 of the first layer 16.

In the embodiments, when each light-emitting element LD is manufactured, the upper surface 16a_2 of the first layer 16a may be separated from a growth substrate, i.e., a first substrate (refer to "1" of FIG. 5) through an LLO method, and the lower surface 15a of the second electrode 15 may be separated from a support substrate, i.e., a second substrate (refer to "2" of FIG. 13) through a CLO method.

Since the upper surface 16a_2 and the lower surface 15a are separated from the corresponding substrates through the LLO method and the CLO method rather than a physical separation method, each of the upper surface 16a_2 of the first layer 16a and the lower surface 15a of the second electrode 15 may have approximately (or averagely) have constant surface roughness. As illustrated in FIGS. 26 and 27, the upper surface 16a_2 of the first layer 16a and the lower surface 15a of the second electrode 15 may have a flat surface. An area of the second contact surface CNF2 between the upper surface 16a_2 of the first layer 16a and the second contact electrode CNE2 may be the same or similar to an area of the first contact surface CNF1 between the lower surface 15a of the second electrode 15 and the first contact electrode CNE1. When the area of the first contact surface CNF1 and the area of the second contact surface CNF2 are the same or similar, contact resistance of the first contact surface CNF1 and contact resistance of the second contact surface CNF2 may be the same or similar. When the area of the first contact surface CNF1 and the area of the second contact surface CNF2 are different, the contact resistance of the first contact surface CNF1 and the contact resistance of the second contact surface CNF2 may be different. A spreading direction of a current may be non-uniform at the first end portion EP1 and the second end portion EP2 of each light-emitting element LD. When the spreading direction of the current is non-uniform, a flow of a current in the active layer 12 of each light-emitting element LD may be non-uniform, and efficiency of current spreading may also be reduced. Thus, overall luminance and driving voltage characteristics may be degraded in each pixel PXL of the display device using the light-emitting element LD as a light source.

In the embodiments, the upper surface 16a_2 of the first layer 16a disposed at the second end portion EP2 of each light-emitting element device LD and the lower surface 15a of the second electrode 15 disposed at the first end portion EP1 of the corresponding light-emitting element LD may have a flat surface by using an LLO method or a CLO method rather than a physical separation method, and thus, the area of the first contact surface CNF1 and the area of the second contact surface CNF2 may be the same or similar. As a result, the first end portion EP1 and the second end portion EP2 of the corresponding light-emitting element LD may have the same or similar contact resistance.

According to the embodiments, the second electrode 15 in ohmic contact with the second semiconductor layer 13 may be disposed at the first end portion EP1 of each light-emitting element LD, and the first electrode 16 in ohmic contact with the first semiconductor layer 11 may be disposed at the second end portion EP2 of each light-emitting element LD. Thus, the characteristics of the first end portion EP1 and the second end portion EP2 of the corresponding light-emitting element LD may be uniform. Since the characteristics of both end portions EP1 and EP2 of each light-emitting element LD are uniform, the light-emitting elements LD may have uniform luminous efficiency. Accordingly, luminance of each pixel PXL in which the light-emitting elements LD are aligned and luminance of the adjacent pixels PXL adjacent to the corresponding pixel PXL may be uniform. As a result, the display device including the pixels PXL may have uniform luminance over an entire area.

Figure 30:
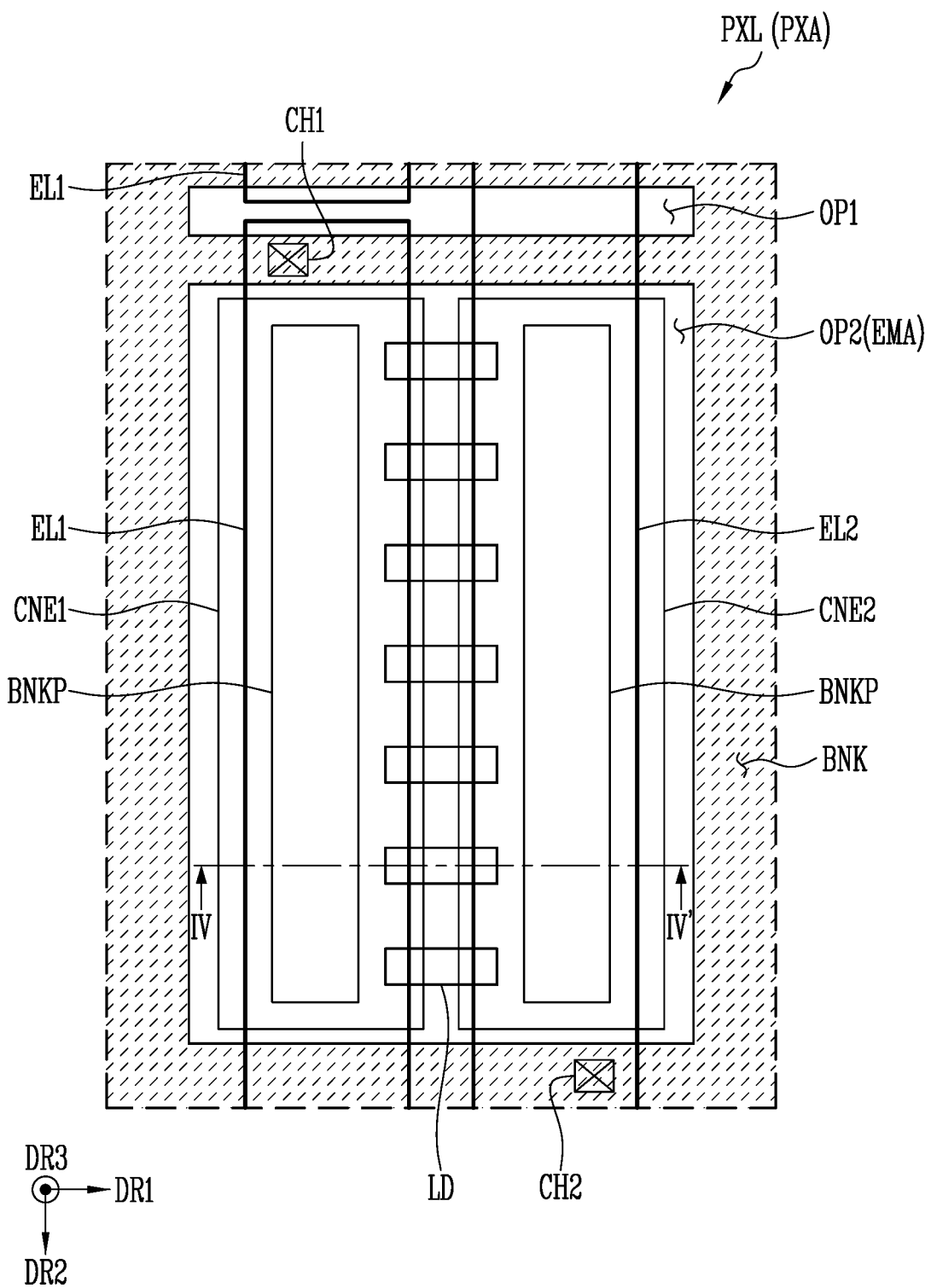
FIG. 30 is a schematic plan view illustrating a pixel according to an embodiment.
Figure 31:
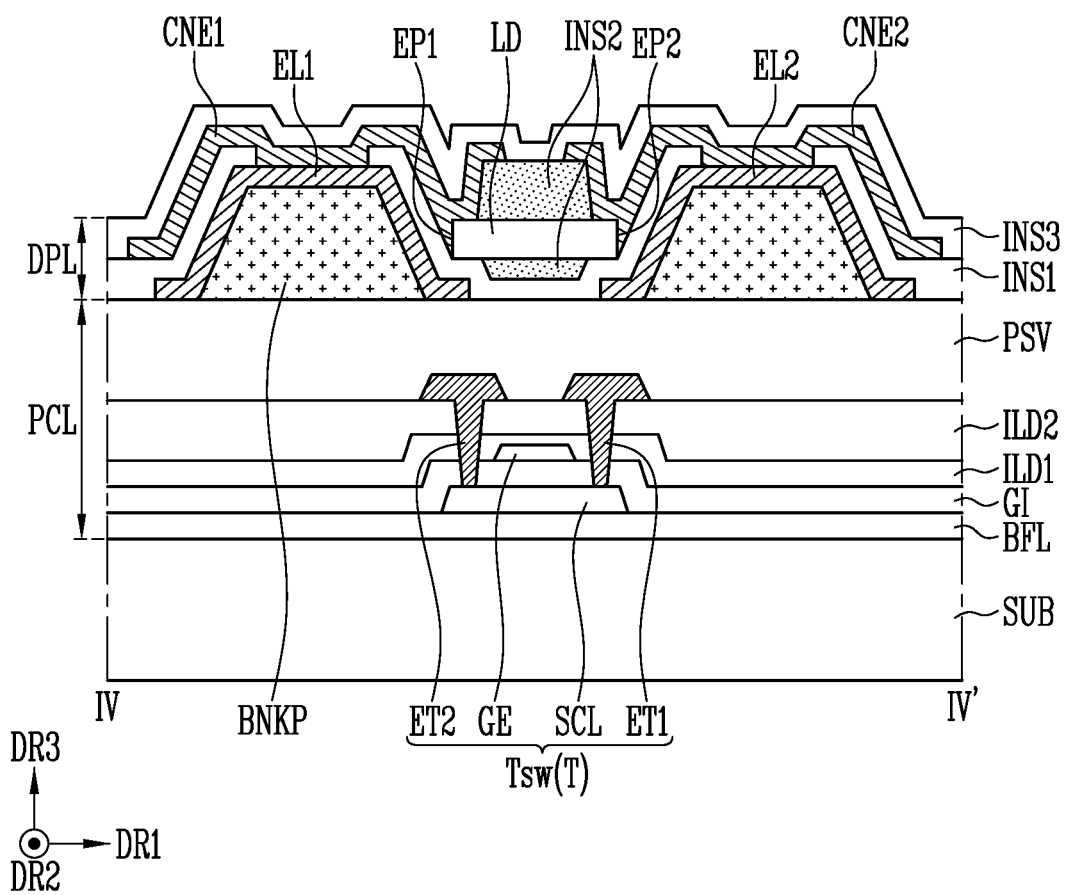
FIG. 31 is a cross-sectional view taken along line IV-IV' of FIG. 30.
Figure 32:
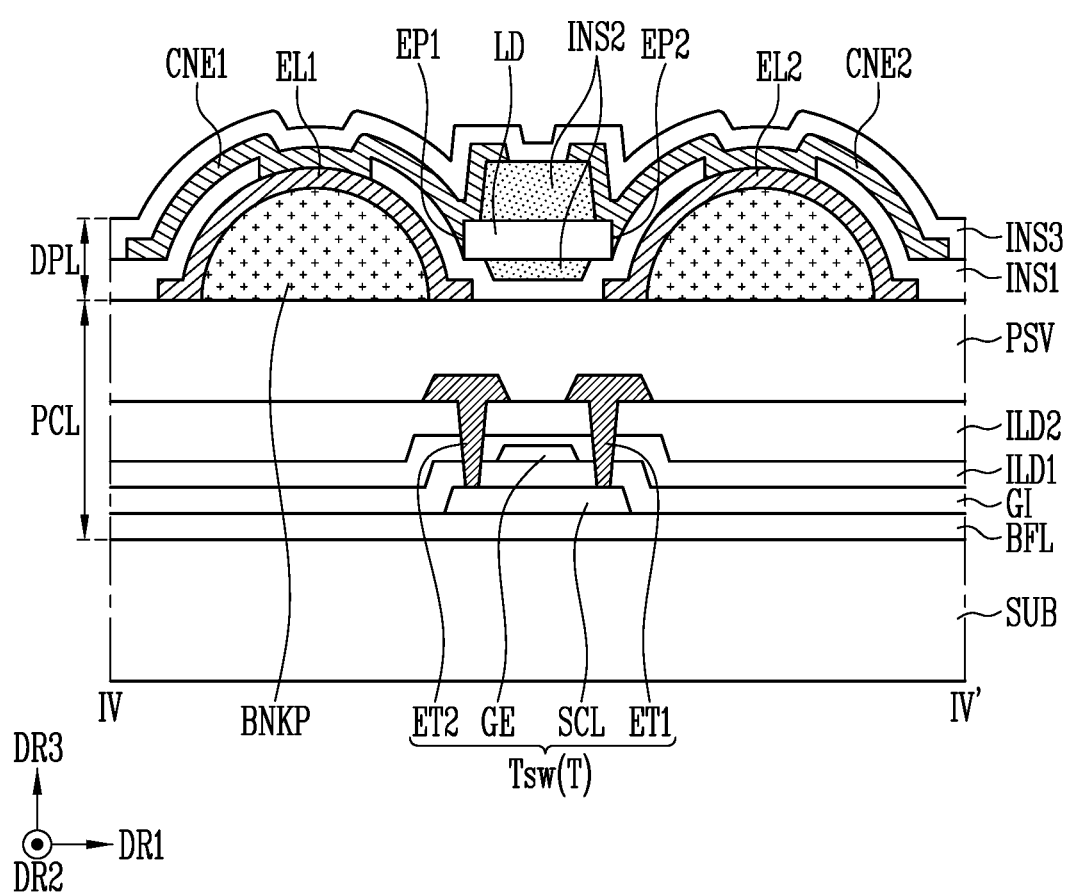
FIG. 32 is a cross-sectional view corresponding to line IV-IV' of FIG. 30 which illustrates a bank pattern of FIG. 31 that is implemented according to an embodiment.
Figure 33:
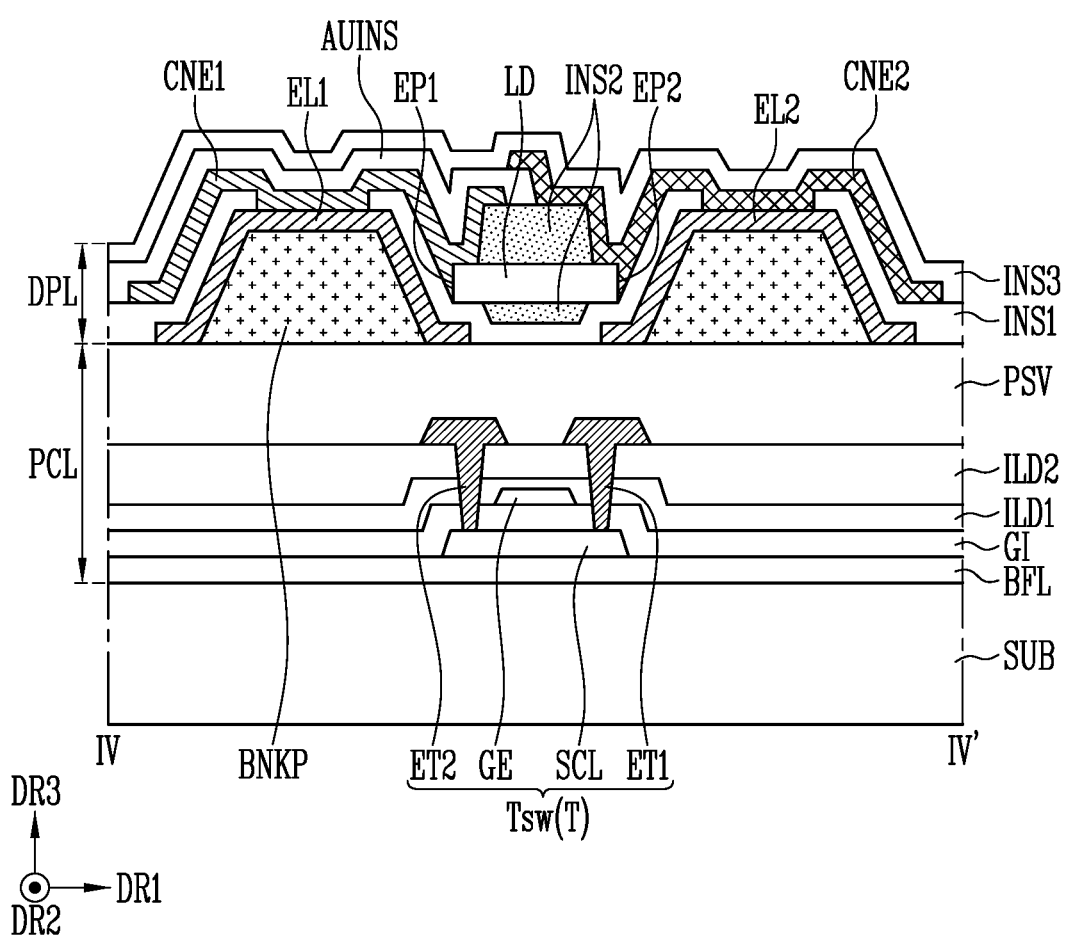
FIG. 33 is a cross-sectional view corresponding to line IV-IV' of FIG. 30 which illustrates first and second contact electrodes of FIG. 31 that are implemented according to an embodiment.

FIG. 30 is a schematic plan view illustrating a pixel according to another embodiment. FIG. 31 is a cross-sectional view taken along line IV-IV' of FIG. 30. FIG. 32 is a cross-sectional view corresponding to line IV-IV' of FIG. 30 which illustrates a bank pattern of FIG. 31 that is implemented according to another embodiment. FIG. 33 is a cross-sectional view corresponding to line IV-IV' of FIG. 30 which illustrates first and second contact electrodes of FIG. 31 that are implemented according to another embodiment.

A pixel PXL illustrated in FIGS. 30 to 33 may have a configuration that is substantially the same or similar to that of the pixel illustrated in FIGS. 23 to 29 except that a bank pattern BNKP is disposed between a passivation layer PSV and each of first and second pixel electrodes EL1 and EL2.

Accordingly, in relation to the pixel of FIGS. 30 to 33, differences from the above-described an embodiment will be mainly described in order to avoid redundant descriptions.

Referring to FIGS. 30 to 33, a support member (or pattern) may be disposed between each of the first and second pixel electrodes EL1 and EL2 and the passivation layer PSV. As an example, as illustrated in FIGS. 31 to 33, the bank pattern BNKP may be disposed between each of the first and second pixel electrodes EL1 and EL2 and the passivation layer PSV.

The bank pattern BNKP may be disposed in an emission area EMA of a pixel area PXA in each pixel PXL, from which light is emitted. In order to guide light emitted from light-emitting elements LD in an image display direction of a display device, the bank pattern BNKP may be a support member which supports each of the first and second pixel electrodes EU and EL2 to change a surface profile (or shape) of each of the first and second pixel electrodes EL1 and EL2.

The bank pattern BNKP may be provided between the passivation layer PSV and the first and second pixel electrodes EL1 and EL2 in the emission area EMA of the corresponding pixel PXL.

The bank pattern BNKP may be an inorganic insulating film including an inorganic material or an organic insulating film including an organic material. According to embodiments, the bank pattern BNKP may include a single organic insulating film and/or a single inorganic insulating film, but the embodiments are not limited thereto. According to embodiments, the bank pattern BNKP may be provided in the form of a multi-film in which at least one organic insulating film and at least one inorganic insulating film are stacked. However, the material of the bank pattern BNKP is not limited thereto, and according to the embodiments, the bank pattern BNKP may include a conductive material.

The bank pattern BNKP may have a cross section having a trapezoidal shape of which a width is gradually decreased upward from a surface (for example, an upper surface) of the passivation layer PSV in a third direction DR3, but the embodiments are not limited thereto. According to embodiments, as illustrated in FIG. 32, the bank pattern BNKP may have a curved surface including a cross section with a semi-elliptical shape or a semicircular shape (or hemisphere shape) of which a width is gradually decreased upward from a surface of the passivation layer PSV in the third direction DR3. When viewed in a cross section, the shape of the bank pattern BNKP is not limited to the above-described embodiments and may be varied as long as the efficiency of the light emitted from each of the light-emitting elements LD is improved.

Each of the first and second pixel electrodes EL1 and EL2 may be provided and/or formed on the corresponding bank pattern BNKP. Each of the first and second pixel electrodes EL1 and EL2 may have a surface profile corresponding to the shape of the bank pattern BNKP disposed thereunder when viewed in a cross section. Accordingly, light emitted from the light-emitting elements LD may be reflected by each of the first and second pixel electrodes EL1 and EL2 to further travel in an image display direction of a display device. Each of the bank pattern BNKP and the first and second pixel electrodes EL1 and EL2 may be used as a reflective member to improve light efficiency of a display device by guiding light emitted from the light-emitting elements LD in a desired direction. Accordingly, luminous efficiency of the light-emitting elements LD may be further improved.

A first contact electrode CNE1 and a second contact electrode CNE2 may be disposed to be spaced apart from each other in a first direction DR1 in a plan view. As an example, the first contact electrode CNE1 and the second contact electrode CNE2 may be disposed to be spaced apart from each other by a certain or predetermined interval on a second insulating layer INS2 on the light-emitting elements LD. The first contact electrode CNE1 and the second contact electrode CNE2 may be provided on the same layer and may be formed through the same process. However, the embodiments are not limited thereto, and the first and second contact electrodes CNE1 and CNE2 may be provided on different layers and may be formed through different processes. As illustrated in FIG. 33, an additional insulating layer AUINS may be provided and/or formed between the first contact electrode CNE1 and the second contact electrode CNE2. The additional insulating layer AUINS may be provided on the first contact electrode CNE1 to prevent the first contact electrode CNE1 from being externally exposed, thereby preventing corrosion of the first contact electrode CNE1. The additional insulating layer AUINS may include an inorganic insulating film made of an inorganic material or an organic insulating film made of an organic material. As an example, the additional insulating layer AUINS may include at least one material selected from metal oxides such as silicon nitride ($SiN_x$), silicon oxide ($SiO_x$), silicon oxynitride ($SiO_xN_y$), and aluminum oxide ($AlO_x$), but the embodiments are not limited thereto. In addition, the additional insulating layer AUINS may be formed as a single-film or a multi-film.

A third insulating layer INS3 may be provided and/or formed on the first and second contact electrodes CNE1 and CNE2. The third insulating layer INS3 may be an inorganic insulating film including an inorganic material or an organic insulating film including an organic material. As an example, the third insulating layer INS3 may have a structure in which at least one inorganic insulating layer and at least one organic insulating layer are alternately stacked. The third insulating layer INS3 may entirely cover a display element layer DPL to prevent external water or moisture from being introduced into the display element layer DPL including the light-emitting elements LD. According to embodiments, at least one overcoat layer (for example, a layer that planarizes an upper surface of the display element layer DPL) may be further disposed on the third insulating layer INS3.

In a light-emitting element, a method of manufacturing the light-emitting element, and a display device including the light-emitting element, since a first electrode in ohmic contact with an n-type semiconductor layer is separated from a growth substrate (first substrate) using a laser lift-off method, and a second electrode in ohmic contact with a p-type semiconductor layer is separated from a support substrate (second substrate) using a chemical lift-off method, a separation surface of the first electrode and a separation surface of the second electrode may have constant surface roughness. Accordingly, it is possible to manufacture a light-emitting element of which both end portions have uniform characteristics.

In addition, a contact area of a first contact electrode in contact with the first electrode of each light-emitting element may be substantially the same or similar to a contact area of a second contact electrode in contact with the second electrode of the corresponding light-emitting element. Accordingly, it is possible to minimize defects due to non-uniform contact areas at both end portions of each light-emitting element, thereby improving the reliability of the corresponding light-emitting element.

The effects according to an embodiment are not limited by the above-described contents, and other effects are included in the specification.

Although embodiments have been described, it is understood that the disclosure should not be limited to these embodiments but various changes and modifications can be made by one ordinary skilled in the art within the spirit and scope of the disclosure as hereinafter claimed.

Therefore, the technical scope of the disclosure is not limited to the embodiments described herein, but should be determined by claims.

What is claimed is:

1. A light-emitting element comprising:
    a first end portion and a second end portion that are disposed in a length direction of the light-emitting element;
    a first electrode corresponding to the first end portion;
    a first semiconductor layer disposed on the first electrode;
    an active layer disposed on the first semiconductor layer;
    a second semiconductor layer disposed on the active layer; and
    a second electrode disposed on the second semiconductor layer and corresponding to the second end portion,
    wherein
    the second electrode includes:
        a first layer disposed on the first semiconductor layer; and
        a second layer disposed on the first layer,
    the first layer and the second layer include a transparent conductive material,
    the first semiconductor layer includes a p-type semiconductor layer doped with a p-type dopant,
    the second semiconductor layer includes an n-type semiconductor layer doped with an n-type dopant,
    the first electrode is in ohmic contact with the first semiconductor layer,
    the second electrode is in ohmic contact with the second semiconductor layer, and
    each of the first electrode, the first semiconductor layer, the active layer, the second semiconductor layer and the second electrode have a same cross-sectional shape corresponding to a shape of the light-emitting element.

2. The light-emitting element of claim 1, wherein the first layer includes a transparent metal, and the second layer includes a transparent conductive oxide.

3. The light-emitting element of claim 2, wherein an outer surface of the second layer includes an uneven pattern having substantially regular periodicity.

4. The light-emitting element of claim 2, wherein an outer surface of the second layer includes an uneven pattern having a substantially irregular shape.

5. The light-emitting element of claim 1, further comprising:
an insulating film surrounding an outer circumferential surface of each of the first electrode, the first semiconductor layer, the active layer, the second semiconductor layer, and the second electrode.

6. The light-emitting element of claim 5, wherein a thickness of a region of the insulating film corresponding to the second end portion gradually decreases upward in the length direction.

7. The light-emitting element of claim 6, wherein the region of the insulating film corresponding to the second end portion has a shape different from a region of the insulating film corresponding to the first end portion.

8. The light-emitting element of claim 5, wherein the insulating film surrounds a portion of the outer circumferential surface of the second electrode to expose at least a portion of the second electrode.

9. The light-emitting element of claim 1, wherein a lower surface of the first electrode is substantially flat and parallel to an upper surface of the second electrode in the length direction.

10. The light-emitting element of claim 1, a surface of the first electrode facing away from the first semiconductor layer and a surface of the second electrode facing away from the second semiconductor layer have a constant surface roughness.

11. A display device comprising:
a first pixel electrode and a second pixel electrode which are spaced apart from each other in a first direction on a substrate and extend in a second direction different from the first direction; and
light-emitting elements which are disposed between the first pixel electrode and the second pixel electrode and each include a first end portion and a second end portion in a length direction of light-emitting elements;
a first contact electrode disposed on the first pixel electrode and the first end portion of each of the light-emitting elements, and
a second contact electrode disposed on the second pixel electrode and the second end portion of each of the light-emitting elements, wherein
the first contact electrode is electrically connected to the first pixel electrode,
the second contact electrode is electrical connected to the second pixel electrode,
each of the light-emitting elements includes:
a first electrode corresponding to the first end portion;
a first semiconductor layer disposed on the first electrode;
an active layer disposed on the first semiconductor layer;
a second semiconductor layer disposed on the active layer; and
a second electrode corresponding to the second end portion and including a first layer disposed on the second semiconductor layer and a second layer disposed on the first layer,
each of the first and second end portions overlaps one of the first and second pixel electrodes in a cross-section view,
a contact area between the first contact electrode and the first electrode is substantially the same as the contact area between the second contact electrode and the second electrode, and
the first layer and the second layer include a transparent conductive material.

12. The display device of claim 11, wherein
the first semiconductor layer includes a p-type semiconductor layer doped with a p-type dopant,
the second semiconductor layer includes an n-type semiconductor layer doped with an n-type dopant,
the first electrode is in ohmic contact with the first semiconductor layer, and
the second electrode is in ohmic contact with the second semiconductor layer.

13. The display device of claim 11, wherein a contact resistance of the first end portion of the light emitting elements is substantially similar to a contact resistance of the second end portion of the light emitting elements.

* * * * *